United States Patent
Minamiru et al.

(10) Patent No.: US 9,508,595 B2
(45) Date of Patent: Nov. 29, 2016

(54) METHOD OF TIP SHAPE OF CUTTING MEMBER, SEMICONDUCTOR CHIP MANUFACTURING METHOD, CIRCUIT BOARD, AND ELECTRONIC APPARATUS

(71) Applicant: FUJI XEROX CO., LTD., Tokyo (JP)

(72) Inventors: Takeshi Minamiru, Ebina (JP); Hiroaki Tezuka, Ebina (JP); Michiaki Murata, Ebina (JP); Kenji Yamazaki, Ebina (JP); Tsutomu Otsuka, Ebina (JP); Shuichi Yamada, Ebina (JP); Kenichi Ono, Ebina (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 14/927,845

(22) Filed: Oct. 30, 2015

(65) Prior Publication Data
US 2016/0049333 A1 Feb. 18, 2016

Related U.S. Application Data

(63) Continuation of application No. PCT/JP2014/066897, filed on Jun. 25, 2014.

(30) Foreign Application Priority Data

| Jul. 1, 2013 | (JP) | 2013-137820 |
| May 27, 2014 | (JP) | 2014-109182 |
| May 27, 2014 | (JP) | 2014-109183 |
| May 27, 2014 | (JP) | 2014-109184 |
| May 27, 2014 | (JP) | 2014-109185 |
| May 27, 2014 | (JP) | 2014-109186 |
| May 27, 2014 | (JP) | 2014-109187 |

(51) Int. Cl.
*H01L 21/78* (2006.01)
*B28D 5/00* (2006.01)
(Continued)

(52) U.S. Cl.
CPC .............. *H01L 21/78* (2013.01); *B23D 65/00* (2013.01); *B28D 5/0011* (2013.01); *B28D 5/022* (2013.01)

(58) Field of Classification Search
CPC ........... H01L 2924/00; H01L 2924/14; H01L 29/00; H01L 29/14; H01L 21/68; H01L 21/78; H01L 21/6835; H01L 21/6836
USPC ......................................... 438/460; 257/620
See application file for complete search history.

(56) References Cited

U.S. PATENT DOCUMENTS

| 5,389,198 A | 2/1995 | Koide et al. |
| 7,897,485 B2 | 3/2011 | Parekh |

(Continued)

FOREIGN PATENT DOCUMENTS

| JP | 61-267343 A | 11/1986 |
| JP | 04-010554 A | 1/1992 |

(Continued)

OTHER PUBLICATIONS

Search Report dated Sep. 16, 2014, issued by the International Searching Authority in counterpart International Application No. PCT/JP2014/066897 (PCT/ISA/210).

(Continued)

*Primary Examiner* — Monica D Harrison
(74) *Attorney, Agent, or Firm* — Sughrue Mion, PLLC

(57) ABSTRACT

A design method includes a process of preparing plural cutting members having different degrees of taper in a tip portion thereof, a process of preparing plural grooves on a front surface side having the same shape, a process of confirming a breakage status when a groove on a rear surface side is formed by the plural cutting members, and a process of selecting, when it is confirmed that both of a cutting member that causes breakage and a cutting member that does not cause the breakage are included, the degree of taper of the cutting member that does not cause the breakage as a tip shape of a cutting member to be used in a mass production process.

12 Claims, 13 Drawing Sheets

(51) Int. Cl.
  *B28D 5/02* (2006.01)
  *B23D 65/00* (2006.01)

(56) References Cited

U.S. PATENT DOCUMENTS

| | | |
|---|---|---|
| 2003/0121511 A1 | 7/2003 | Hashimura et al. |
| 2009/0294913 A1 | 12/2009 | Kawashima |
| 2010/0002491 A1 | 1/2010 | Hwang et al. |

FOREIGN PATENT DOCUMENTS

| | | |
|---|---|---|
| JP | 05-010969 A | 1/1993 |
| JP | 07-183255 A | 7/1995 |
| JP | 09-172029 A | 6/1997 |
| JP | 2001-284293 A | 10/2001 |
| JP | 2003-124151 A | 4/2003 |
| JP | 2004-001147 A | 1/2004 |
| JP | 2009-088252 A | 4/2009 |
| JP | 2010-016361 A | 1/2010 |
| JP | 2010-016381 A | 1/2010 |

OTHER PUBLICATIONS

Written Opinion dated Sep. 16, 2014, issued by the International Searching Authority in counterpart International Application No. PCT/JP2014/066897 (PCT/ISA/237).

Office Action dated Jan. 6, 2015, issued by the Japanese Patent Office in counterpart Japanese Application No. 2014-109187.

| CURVATURE RADIUS OF TIP CORNER PORTION ($\mu$m) | 1 | 2 | 3 | 4 | 5 | 6 | 7 | 8 | 9 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|
| KERF WIDTH ($\mu$m) | 25 | 25 | 25 | 25 | 25 | 25 | 24 | 24 | 23 | 19 | 18 | 17 | 16 | 15 | 14 | 13 | 11 | 10 | 9 | 8 |
| USE PROPRIETY | × | × | × | × | × | × | × | × | ○ | ○ | ○ | ○ | ○ | ○ | ○ | ○ | ○ | ○ | × | × |

| THICKNESS OF STEP PORTION T ($\mu$m) | GROOVE WIDTH Sa ON FRONT SURFACE SIDE($\mu$m) | | | |
|---|---|---|---|---|
| | 5 | 7.5 | 10 | 15 |
| 45 | A | A | A | A |
| 25 | D | B | A | A |

| A | EQUAL TO OR GREATER THAN ±7.5 $\mu$m |
|---|---|
| B | ±5 ~ 7.5 $\mu$m |
| C | ±3 ~ 5 $\mu$m |
| D | SMALLER THAN ± 3 $\mu$m |

METHOD OF TIP SHAPE OF CUTTING MEMBER, SEMICONDUCTOR CHIP MANUFACTURING METHOD, CIRCUIT BOARD, AND ELECTRONIC APPARATUS

CROSS REFERENCE TO RELATED APPLICATION

This is a continuation of International Application No. PCT/JP2014/066897 filed on Jun. 25, 2014, and claims priority from Japanese Patent Application No. 2013-137820, filed on Jul. 1, 2013, Japanese Patent Application No. 2014-109182, filed on May 27, 2014, Japanese Patent Application No. 2014-109183, filed on May 27, 2014, Japanese Patent Application No. 2014-109184, filed on May 27, 2014, Japanese Patent Application No. 2014-109185, filed on May 27, 2014, Japanese Patent Application No. 2014-109186, filed on May 27, 2014, and Japanese Patent Application No. 2014-109187, filed on May 27, 2014.

BACKGROUND

Technical Field

The present invention relates to a design method of a tip shape of a cutting member, a semiconductor chip manufacturing method, a circuit board, and an electronic apparatus.

SUMMARY

An aspect of the present invention provides a design method of a tip shape of a cutting member used in a semiconductor piece manufacturing method including a process of forming a groove on a front surface side on a front surface of a substrate, and a process of forming a groove on a rear surface side that communicates with the groove on the front surface side by a rotating cutting member that has a thickness larger than the width of the groove on the front surface side from a rear surface of the substrate and individualizing the substrate into semiconductor pieces having a step portion formed by a difference between the width of the groove on the front surface side and the width of the groove on the rear surface side, the design method including: a process of preparing a plurality of cutting members having different degrees of taper in a tip portion thereof; a process of preparing a plurality of grooves on the front surface side having the same shape; a process of confirming a breakage status of the step portion with respect to respective cases where the groove on the rear surface side is formed by the plural cutting members with respect to the plural grooves on the front surface side; and a process of selecting, when it is confirmed that both of a cutting member that causes breakage of the step portion and a cutting member that does not cause the breakage of the step portion are included in the plurality of cutting members, the degree of taper of the cutting member that does not cause the breakage of the step portion as a tip shape of a cutting member to be used in a mass production process.

BRIEF DESCRIPTION OF THE DRAWINGS

Exemplary embodiment(s) of the present invention will be described in detail based on the following figures, wherein.

DESCRIPTION OF EMBODIMENTS

Figure 1:
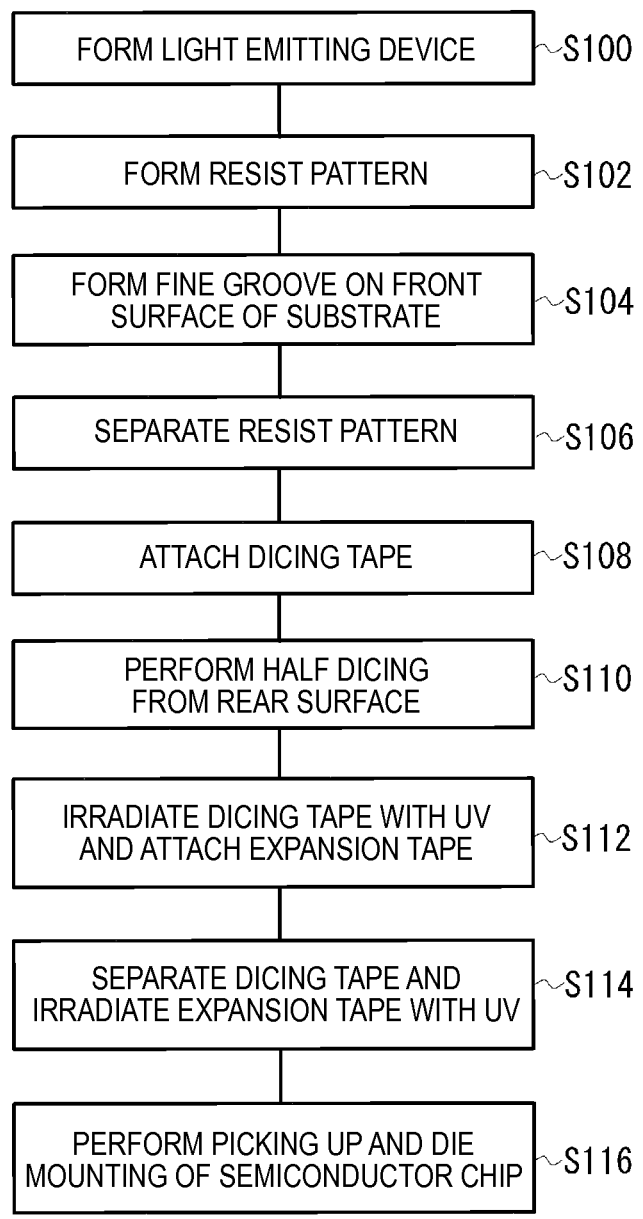
FIG. 1 is a flow diagram illustrating an example of a semiconductor piece manufacturing process according to an embodiment of the invention.

A semiconductor piece manufacturing method of the invention is applied to a method for dividing (individualizing) a substrate shaped member such as a semiconductor wafer on which plural semiconductor devices are formed to manufacture individual semiconductor pieces (semiconductor chips). The semiconductor element formed on the substrate is not particularly limited, and may include a light emitting device, an active device, a passive device, or the like. In a preferred embodiment, the manufacturing method of the invention is applied to a method of extracting a semiconductor piece that includes a light emitting device from a substrate, in which the light emitting device may be a surface light emitting semiconductor laser, a light emitting diode, or a light emitting thyristor, for example. A single semiconductor piece may include a single light emitting device, or may include plural light emitting devices that are arranged in an array form. Further, the single semiconductor piece may include a drive circuit that drives the single or plural light emitting devices. Further, the substrate may be a substrate formed of silicon, SiC, compound semiconductor, sapphire, or the like, but are not limited thereto, and may be a substrate formed of other materials as long as the substrate includes at least the semiconductor (hereinafter, collectively referred to as a semiconductor substrate). In a preferred embodiment, the substrate is a III-V compound semiconductor substrate made of GaAs or the like on which a light emitting device such as a surface light emitting semiconductor laser or a light emitting diode is formed.

In the following description, a method for extracting individual semiconductor pieces (semiconductor chips) from a semiconductor substrate on which plural light emitting devices are formed will be described with reference to the accompanying drawings. It should be noted that the scale or shape in the drawings is emphasized for ease of understanding of features of the invention and is not necessarily the same as the scale or shape of an actual device.

EMBODIMENT

FIG. 1 is a flowchart illustrating an example of a semiconductor piece manufacturing process according to an embodiment of the invention. As shown in FIG. 1, the semiconductor piece manufacturing method of the present embodiment includes a process of forming a light emitting device (S100), a process of forming a resist pattern (S102), a process of forming a fine groove on a front surface of a semiconductor substrate (S104), a process of removing the resist pattern (S106), a process of attaching a dicing tape to the front surface of the semiconductor substrate (S108), a process of performing half dicing from a rear surface of the semiconductor substrate (S110), a process of irradiating the dicing tape with ultraviolet rays (UV) and attaching an expansion tape to the rear surface of the semiconductor substrate (S112), a process of removing the dicing tape and irradiating the expansion tape with ultraviolet rays (S114), and a process of picking up a semiconductor piece (semiconductor chip) to perform die mounting on a circuit board or the like (S116). Cross-sectional views of a semiconductor substrate shown in FIGS. 2A to 2D and FIGS. 3A to 3E correspond to the respective processes of steps S100 to S116, respectively.

Figure 2A:
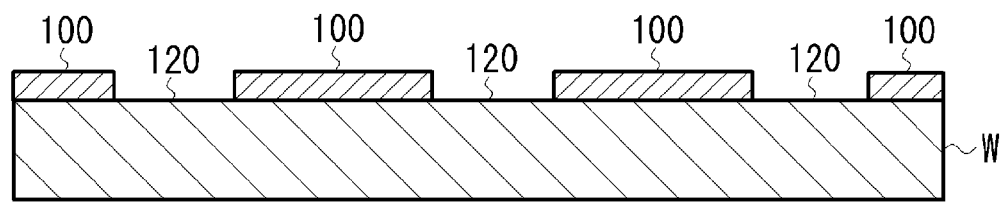
FIGS. 2A to 2D are cross-sectional views schematically illustrating a semiconductor substrate in a semiconductor piece manufacturing process according to an embodiment of the invention.

In the process of forming the light emitting device (S100), as shown in FIG. 2A, plural light emitting devices 100 are formed on a front surface of a semiconductor substrate W made of GaAs or the like. The light emitting device 100 is a surface light emitting semiconductor laser, a light emitting diode, a light emitting thyristor, or the like. In the figures, it is shown that one region corresponds to the light emitting device 100, but one light emitting device 100 is only an example of an element included in one individualized semiconductor piece. Thus, it should be noted that plural light emitting devices or another circuit element as well as one light emitting device may be included in the region of one light emitting device 100.

Figure 4:
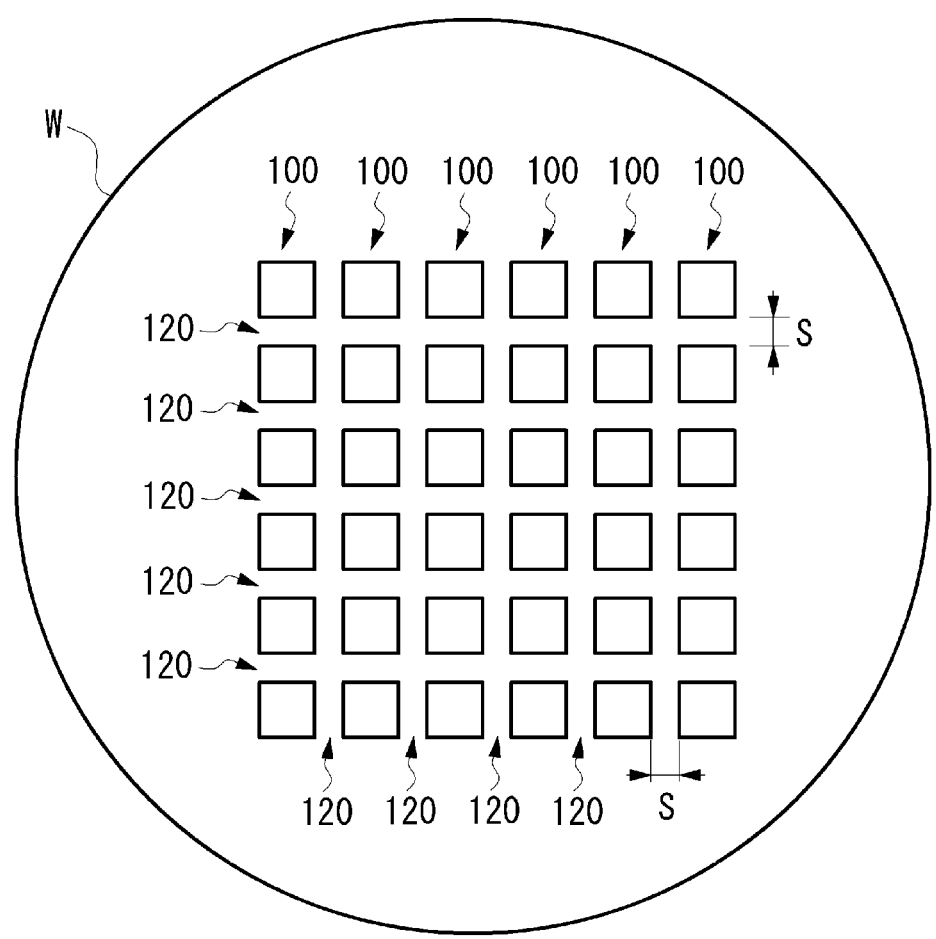
FIG. 4 is a plan view schematically illustrating a semiconductor substrate (wafer) when circuit formation is completed.

FIG. 4 is a plan view illustrating an example of the semiconductor substrate W when the light emitting device forming process is completed. In the figure, for ease of description, only the light emitting devices 100 in a central portion thereof are shown. On the front surface of the semiconductor substrate W, the plural light emitting devices 100 are arranged in an array form in row and column directions. A planar region of one light emitting device 100 generally has a rectangular shape, and the respective light emitting devices 100 are spaced from each other in a grid shape by cutting regions 120 defined by scribe lines or the like with a predetermined space S.

Figure 2B:
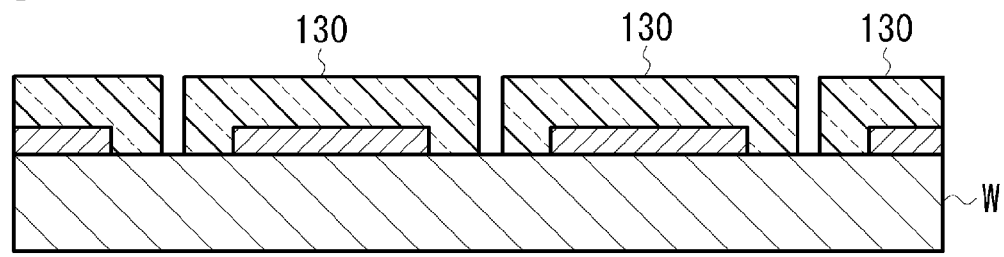

If the formation of the light emitting device is completed, a resist pattern is formed on the front surface of the semiconductor substrate W (S102). As shown in FIG. 2B, a resist pattern 130 is processed so that the cutting region 120 defined by the scribe line or the like on the front surface of the semiconductor substrate W is exposed. The processing of the resist pattern 130 is performed by a photolithography process.

Figure 2C:
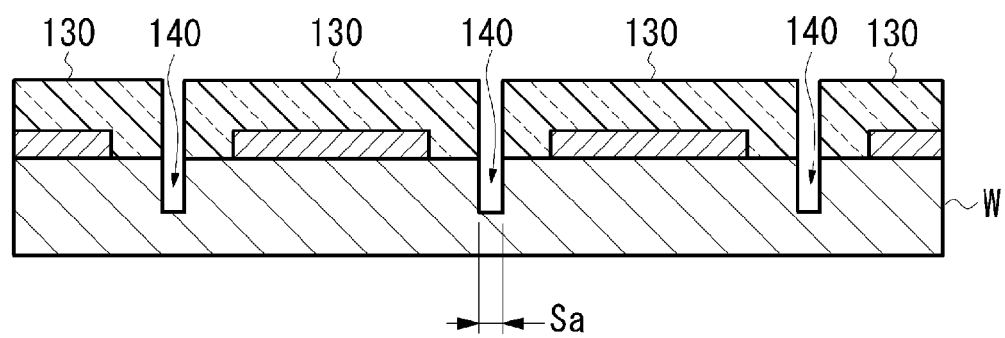

Then, a fine groove is formed on the front surface of the semiconductor substrate W (S104). As shown in FIG. 2C, a fine groove (hereinafter, for ease of description, referred to as a fine groove or a front surface side groove) 140 having a predetermined depth is formed on the front surface of the semiconductor substrate W using the resist pattern 130 as a mask. Such a groove may be formed by anisotropic etching, and preferably, is formed by anisotropic plasma etching which is anisotropic dry etching (reactive ion etching). The groove may be formed by a thin dicing blade, isotropic etching, or the like, but it is preferable that the anisotropic dry etching is used since a narrow deep groove can be formed compared with a case where the front surface side groove is formed by isotropic etching, and since the influence of vibration, stress, or the like on the light emitting device 100 in the vicinity of the fine groove can be suppressed compared with a case where the dicing blade is used. A width Sa of the fine groove 140 is approximately the same as the width of an opening formed in the resist pattern 130. The width Sa of the fine groove 140 is several micrometers to ten and several micrometers, for example. Preferably, the width Sa is approximately 3 µm to approximately 15 µm. Further, the depth is about 10 µm to about 100 µm, for example, which is formed as a depth at least greater than a depth at which a functional element such as a light emitting device is formed. Preferably, the depth of the microgroove 140 is approximately 30 µm to approximately 80 µm. When the fine groove 140 is formed by a general dicing blade, a space S of the cutting region 120 increases up to 40 μm to 60 μm as a total value of a width of the groove of the dicing blade and a margin width that reflects a pitching amount. On the other hand, when the fine groove 140 is formed by the semiconductor process, the width of the groove becomes narrow, and the margin width for cutting can also become narrower than the margin width when the dicing blade is used. In other words, the space S of the cutting region 120 can decrease, and thus, the light emitting devices can be disposed on the wafer with high density to increase the number of acquired semiconductor pieces. The "front surface side" in the embodiment refers to a surface side on which the functional element such as a light emitting device is formed, and a "rear surface side" refers to a surface side opposite to the "front surface side".

Figure 2D:
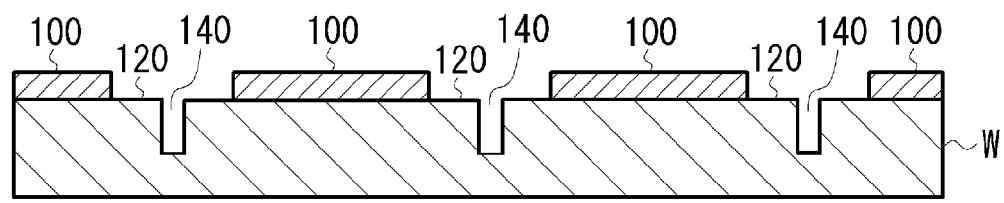

Then, the resist pattern is removed (S106). As shown in FIG. 2D, if the resist pattern 130 is removed from the front surface of the semiconductor substrate, the fine groove 140 formed along the cutting region 120 is exposed on the front surface. Details about the shape of the fine groove 140 will be described later.

Figure 3A:
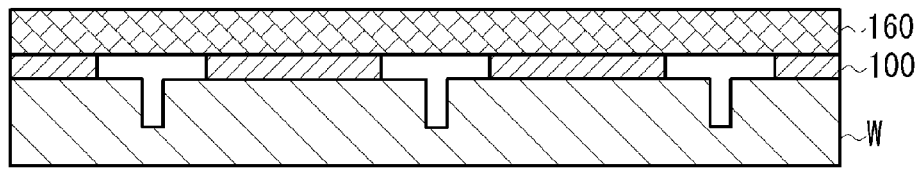
FIGS. 3A to 3E are cross-sectional views schematically illustrating a semiconductor substrate in a semiconductor piece manufacturing process according to an embodiment of the invention.
Figure 3B:
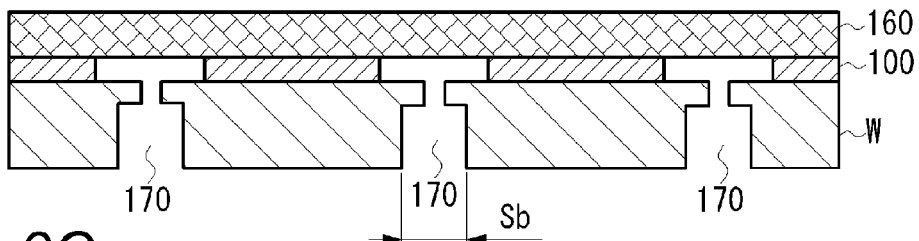

Then, an ultraviolet curing dicing tape is attached (S108). As shown in FIG. 3A, a dicing tape 160 having an adhesive layer is attached on the side of the light emitting device. Then, half dicing is performed along the fine groove 140 by a dicing blade from the rear surface side of the substrate (S110). Positioning of the dicing blade may use a method for disposing an infrared camera above the rear surface side of the substrate and allowing the substrate to transmit an infrared ray to indirectly detect the fine groove 140, a method for disposing a camera above the front surface side of the substrate and directly detecting the position of the fine groove 140, or other known methods. With such positioning, as shown in FIG. 3B, the half dicing is performed by the dicing blade, so that a groove 170 is formed on the rear side of the semiconductor substrate. The groove 170 has a depth that reaches the fine groove 140 formed on the front surface of the semiconductor substrate. Here, the fine groove 140 is formed with a width narrower than that of the groove 170 on the rear surface side formed by the dicing blade. This is because when the fine groove 140 is formed with the width narrower than that of the groove 170 on the rear surface side, the number of semiconductor pieces capable of being acquired from a single wafer can increase compared with a case where the semiconductor substrate is cut only using the dicing blade. If the fine groove of several micrometers to ten and several micrometers shown in FIG. 2C can be formed from the front surface of the semiconductor substrate to the rear surface thereof, it is not necessary to form the groove on the rear surface side using the dicing blade, but it is not easy to form the fine groove with such a depth. Accordingly, as shown in FIG. 3B, the half dicing from the rear surface using the dicing blade is combined.

Figure 3C:
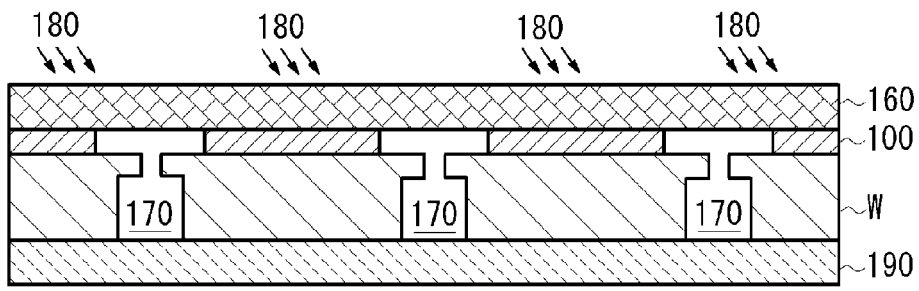

Then, the dicing tape is irradiated with ultraviolet rays (UV), and the expansion tape is attached (S112). As shown in FIG. 3C, the dicing tape 160 is irradiated with ultraviolet rays 180, so that the adhesive layer is cured. Then, an expansion tape 190 is attached to the rear surface of the semiconductor substrate.

Figure 3D:
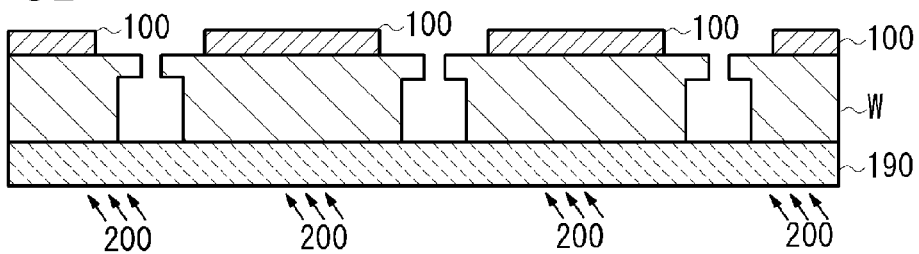

Then, the dicing tape is removed, and the expansion tape is irradiated with ultraviolet rays (S114). As shown in FIG. 3D, the dicing tape 160 is removed from the front surface of the semiconductor substrate. Further, the expansion tape 190 on the rear surface of the substrate is irradiated with ultraviolet rays 200, so that the adhesive layer is cured. The expansion tape 190 has elasticity in a base material thereof.

The tape is expanded to increase the interval between the light emitting devices so as to easily pick up the individualized semiconductor pieces after dicing.

Figure 3E:
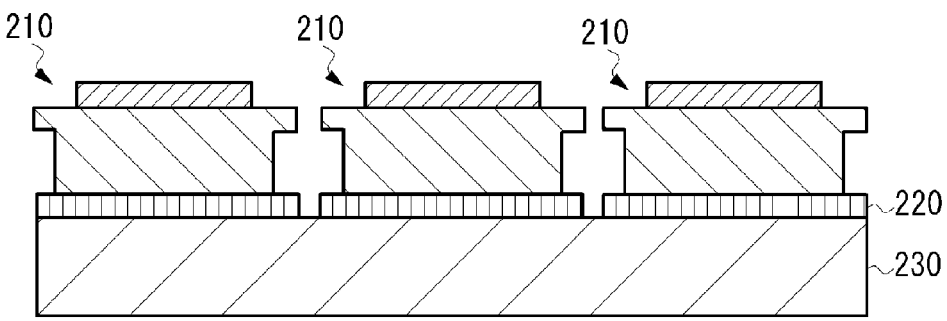

Then, pickup and die mounting of the individualized semiconductor pieces are performed (S116). As shown in FIG. 3E, a semiconductor piece 210 (semiconductor chip) picked up from the expansion tape 190 is mounted on a circuit board 230 through a fixing member 220 such as a conductive paste such as an adhesive or solder.

Figure 5A:
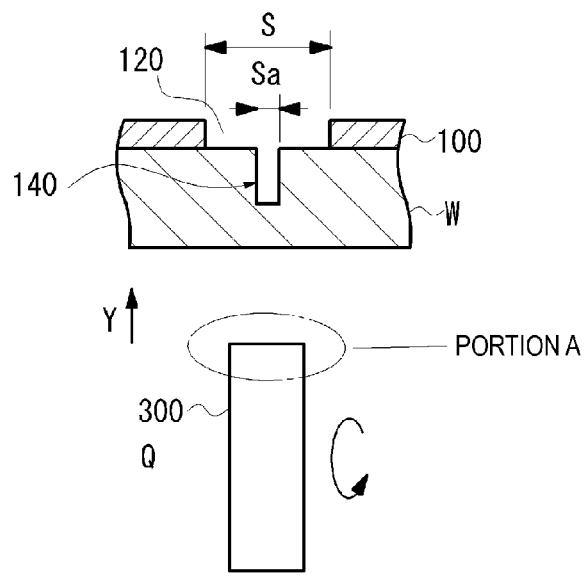
FIG. 5A is a cross-sectional view illustrating a cutting operation of a dicing blade.

Next, details about the half dicing using the dicing blade will be described. FIG. 5A is a cross-sectional view when the half dicing is performed by the dicing blade shown in FIG. 3B.

As described above, the plural light emitting devices 100 are formed on the front surface of the semiconductor substrate W, and are spaced from each other by the cutting regions 120 defined by the scribe lines or the like with the space S. The fine groove 140 having the width Sa is formed in the cutting region 120 by anisotropic dry etching. On the other hand, as shown in FIG. 5A, a dicing blade 300 is a cutting member of a disk shape that rotates around an axis Q, and has a thickness corresponding to the groove 170 having a kerf width Sb. The dicing blade 300 is positioned outside the semiconductor substrate W in a direction parallel to the rear surface of the semiconductor substrate W. Further, by moving the dicing blade 300 in a direction Y perpendicular to the rear surface of the semiconductor substrate W by a predetermined distance, the positioning of the semiconductor substrate W is performed in the thickness direction so that a step portion 400 has a desired thickness T. Further, in a state where the dicing blade 300 is rotated after the positioning, at least one of the dicing blade 300 and the semiconductor substrate W is moved in the direction parallel to the rear surface of the semiconductor substrate W, to thereby form the groove 170 in the semiconductor substrate W. Since the kerf width Sb is larger than the width Sa of the fine groove 140, when the groove 170 reaches the fine groove 140, the step portion 400 having a shape of a cantilevered eaves with the thickness T is formed in the cutting region 120 by a difference between the width Sb and the width Sa. If the center of the dicing blade 300 and the center of the fine groove 140 completely match each other, an extended length of the step portion 400 in the transverse direction is $(Sb-Sa)/2$.

A) Description of Tip Portion

Figure 5B:
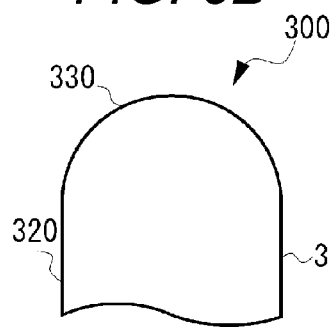
FIGS. 5B to 5F are enlarged cross-sectional views of a tip portion of the dicing blade of the present embodiment.
Figure 5C:
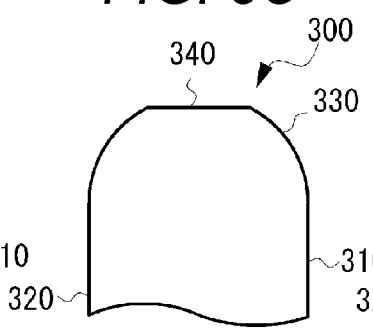
Figure 5D:
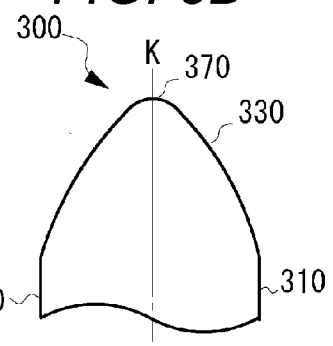
Figure 5E:
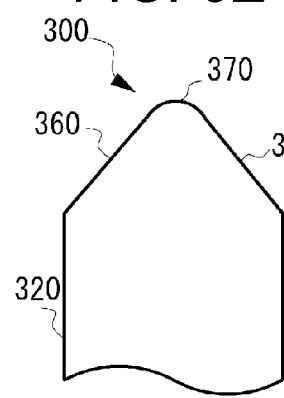
Figure 5F:
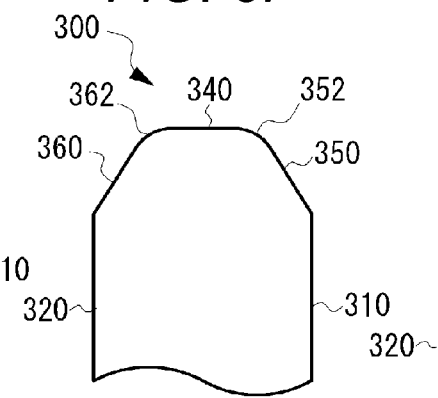
Figure 5G:
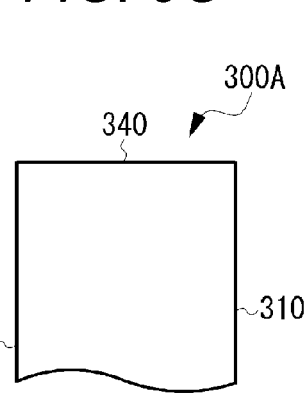
FIG. 5G is an enlarged cross-sectional view of a tip portion of a dicing blade used in general full dicing.

FIGS. 5B to 5F are enlarged cross-sectional views of a tip portion A of the dicing blade 300 that is an example of an embodiment of the invention, and FIG. 5G is an enlarged cross-sectional view of a tip portion A of a dicing blade used in general full dicing. A tip portion of a dicing blade 300A used in the general full dicing includes a side surface 310, a side surface 320 that faces the side surface 310, and a flat top surface 340 that crosses the side surfaces 310 and 320 at a right angle, as shown in FIG. 5G. That is, the dicing blade 300A includes a tip portion having a rectangular cross-sectional shape when seen in a rotational direction. On the other hand, for example, as shown in FIGS. 5A to 5F, the tip portion of the dicing blade 300 of the present embodiment has a tapered shape in which the thickness of the dicing blade 300 gradually becomes thin toward the top portion, in the tip portion of the dicing blade 300.

In the present embodiment, the "top portion" represents a portion of the tip of the dicing blade. In shapes shown in FIGS. 5B, 5D and 5E, the top portion is a point of the tip. Further, in shapes shown in FIGS. 5C and 5F, the top portion is a flat surface except for fine irregularities, and the flat surface is referred to as a "top surface". Further, "tapered"

represents a shape having a portion in which the thickness of the tip portion of the dicing blade 300 gradually becomes thin toward the top portion, and FIGS. 5B to 5F show examples of the tapered shape.

Here, the shapes shown in FIGS. 5B to 5G represent initial shapes when cutting of the semiconductor substrate is performed in a mass production process. That is, the dicing blade 300 of the present embodiment shown in FIGS. 5B to 5F has such a shape in advance as the initial shape in the mass production process. Further, the rectangular tip portion shown in FIG. 5G used in the general full dicing has the rectangular shape in an initial state, but is abraded into a tapered shape having a curved surface 330 as shown in FIGS. 5B to 5D due to continuous use.

In the example shown in FIG. 5B, the pair of side surfaces 310 and 320 and the curved surface 330 between the pair of side surfaces 310 and 320 are provided. Specifically, a distance between the pair of side surfaces 310 and 320 is a width corresponding to the kerf width Sb, and the tip portion includes the curved surface 330 having a semicircular shape between the side surfaces 310 and 320, and does not include a top surface 340 as shown in FIGS. 5C and 5F. The example shown in FIG. 5C has an intermediate shape between the shapes shown in FIGS. 5B and 5G, and has the top surface 340 and the curved surfaces 330 in tip corner portions thereof. The example shown in FIG. 5D does not have the top surface 340, but has the curved surfaces 330 having a curvature radius larger than the curvature radius of the tip corner portions shown in FIGS. 5B and 5C, in which a curved surface 370 having a curvature radius smaller than that of the curved surface 330 is formed at the position of the top portion. As the curved surface 330 shown in FIGS. 5B to 5D comes close to the top portion of the dicing blade 300, a reduction rate of the thickness of the dicing blade 300 increases.

In the example shown in FIG. 5E, the curved surface 370 is formed between two chamfers 350 and 360. In this case, the top surface 340 is not formed, similar to the shape shown in FIG. 5C. In the example shown in FIG. 5F, the side surfaces 310 and 320 that face each other, and the top surface 340 between the side surfaces 310 and 320 are provided, and the chamfers 350 and 360 are formed between the side surfaces 310 and 320, and the top surface 340. Further, a curved surface 352 is formed at a corner portion between the chamfer 350 and the top surface 340, and a curved surface 362 is formed at a corner portion between the chamfer 360 and the top surface 340.

The tip portion of the dicing blade according to the present embodiment may have any tapered shape different from the rectangular tip portion shown in FIG. 5G, as shown in FIGS. 5B to 5F, and may or may not have the top surface as long as there is no particular mention. Further, the tip portions of the dicing blade 300 according to the present embodiment shown in FIGS. 5B to 5F have a line-symmetrical shape with reference to a center K of the thickness of the dicing blade 300 as shown in FIG. 5D. However, if there is no particular mention, the line-symmetrical shape is not essential, and the position of the top portion (top surface) may deviate in the thickness direction of the dicing blade 300.

B) Description of Simulation and Experimental Result

Next, a simulation and an experiment performed for confirming a correspondence relationship between breakage occurrence and a cause thereof, when fine grooves having widths of several micrometers to several tens of micrometers communicate with each other, will be described.

B-1) Description of Simulation Relating to Tip Shape

Figure 6A:
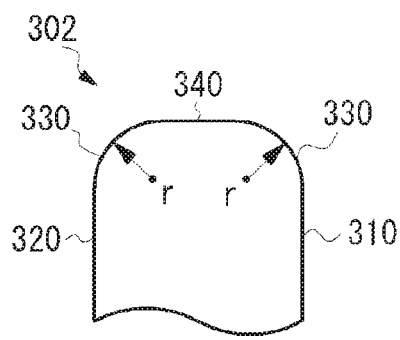
FIG. 6A is an enlarged cross-sectional view illustrating a tip portion of a dicing blade used in a simulation.

FIGS. 6A to 8 are diagrams illustrating simulations and results thereof performed for detecting the relationship between a curvature radius of a tip corner portion of a dicing blade and stress applied to a step portion. An example of a dicing blade 302 used in the simulation is shown in FIG. 6A. FIG. 6A is a cross-sectional shape of the tip portion of the dicing blade 302 seen in the rotational direction. The tip portion of the dicing blade 302 includes side surfaces 310 and 320, the top surface 340 having a predetermined length, and the curved surfaces 330 having a curvature radius r formed between the side surfaces 310 and 320, and the top surface 340, and the tip portion is symmetrically formed with respect to a line orthogonal to a rotational axis, as shown in FIG. 6A.

Figure 6B:
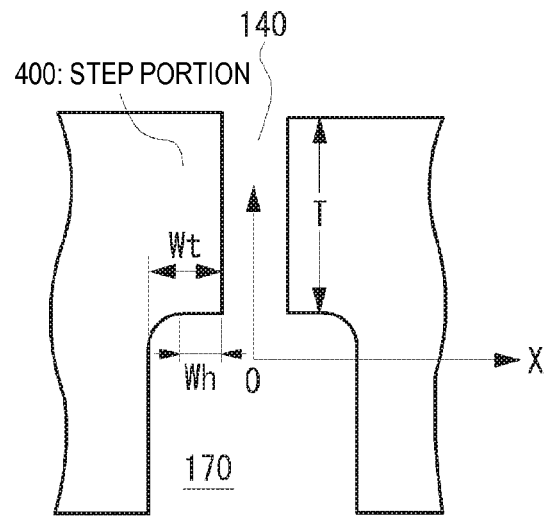
FIG. 6B is a cross-sectional view illustrating the shape of a groove formed on a semiconductor substrate when the dicing blade shown in FIG. 6A is used.

FIG. 6B shows the shape of a groove formed on a semiconductor substrate when the dicing blade 302 having the tip shape shown in FIG. 6A is used. Here, a step difference of a width W is generated between the groove 140 on the front surface side and a vertical side surface of the groove 170 on the rear surface side due to a difference of the positions of the side surface of the groove 140 on the front surface side of the substrate and the side surface of the groove 170 on the rear surface side of the substrate, and a region having a shape of eaves with a thickness T, that is, a step portion 400 is formed due to the step difference. In other words, the step portion 400 is a portion between the step difference formed in a connecting portion of the groove 140 on the front surface side and the groove 170 on the rear surface side, and the front surface of the semiconductor substrate.

Figure 6C:
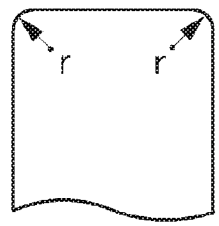
FIGS. 6C and 6D are enlarged cross-sectional views of tip portions of dicing blades having curvature radii r=0.5 and r=12.5 used in a simulation.
Figure 6D:
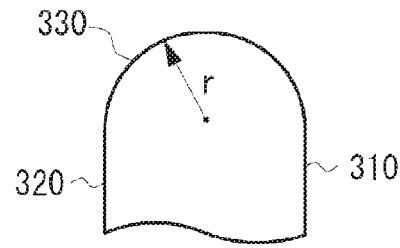

In a current simulation, when the curvature radius r (μm) of the curved surface 330 in the dicing blade 302 is changed to r=0.5, r=2.5, r=5.0, r=7.5, r=10.0, and r=12.5, a stress value applied to the step portion 400 is calculated by a simulation. The thickness of the dicing blade 302 is 25 μm. FIG. 6C shows a tip portion with r=0.5, and FIG. 6D shows the shape of a tip portion with r=12.5. The tip portion of FIG. 6D shows a semicircular shape in which the curvature radius of the tip corner portion is ½ of the thickness of the dicing blade 302. A substrate which is a processing target is a GaAs substrate, the width of the groove of the groove 140 on the front surface side is 5 μm, the thickness T of the step portion 400 is 40 μm, and a load of 2 mN is applied to the step portion 400 from the groove 170 on the rear surface side to the front surface side of the substrate. Further, the center of the width of the groove 140 on the front surface side and the center of the thickness of the dicing blade 302 match each other.

Figure 7:
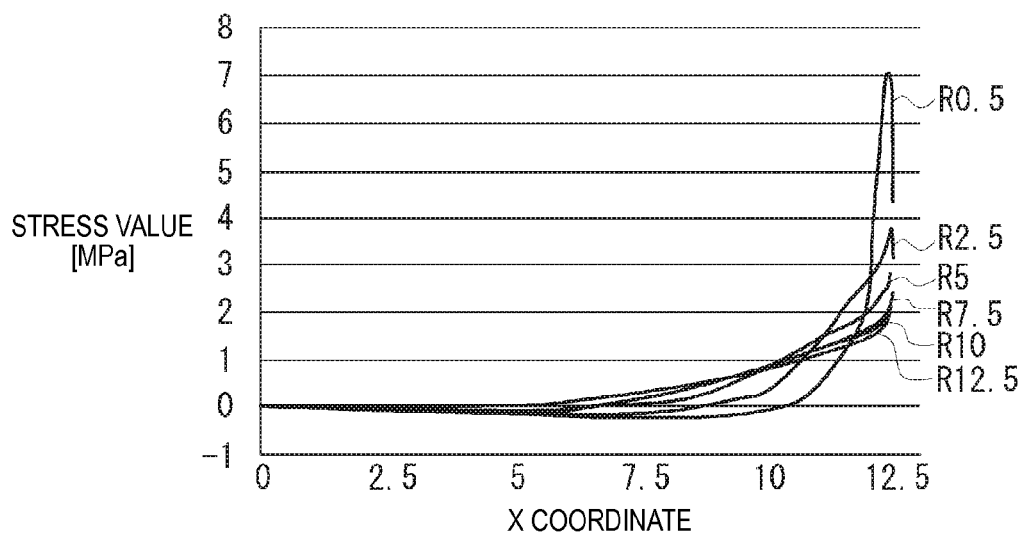
FIG. 7 is a graph where a relationship between a curvature radius of a tip portion of a dicing blade and a stress value in a corner portion of a step portion is simulated.

A graph shown in FIG. 7 represents a simulation result, and shows change in the stress value applied to the step portion 400 when the curvature radius of the tip corner portion is changed. Here, a longitudinal axis represents a stress value "Mpa", and a transverse axis represents an X coordinate when the center of the groove 140 on the front surface side shown in FIG. 6B is set as the origin. From the graph, in any curvature radius r, as the X coordinate comes close to 12.5 μm, that is, as it comes close to the root side of the step portion 400 from the center side of the groove 170 on the rear surface side, the stress increases. Further, it can be understood that if the value of the curvature radius r increases, the stress applied to the root side of the step portion 400 decreases and rising of the stress is alleviated. In other words, in the case of a range of the tip shape used in the current simulation, that is, a tip shape in which the degree of taper is smaller than that of the semicircular tip portion as shown in FIG. 6D, the maximum stress is generated on the root side of the step portion 400. In addition, the stress applied to the root side of the step portion 400 is small in the semicircular tip shape as shown in FIG. 6D, compared with the shape close to the rectangle as shown in FIG. 6C. That is, as the degree of taper increases, the stress applied to the root side of the step portion 400 decreases. Furthermore, in the case of the shape close to the rectangle as shown in FIG. 6C, for example, when r=0.5, it can be understood that the stress is small in a range of the X coordinate that reaches approximately 11 μm compared with a case where the curvature radius r is large, but in a range where the X coordinate exceeds approximately 11 μm, that is, in a portion closer to the root, the stress rapidly increases, and then, the stress concentrates on the vicinity of 12.5 μm on the X coordinate.

Figure 8:
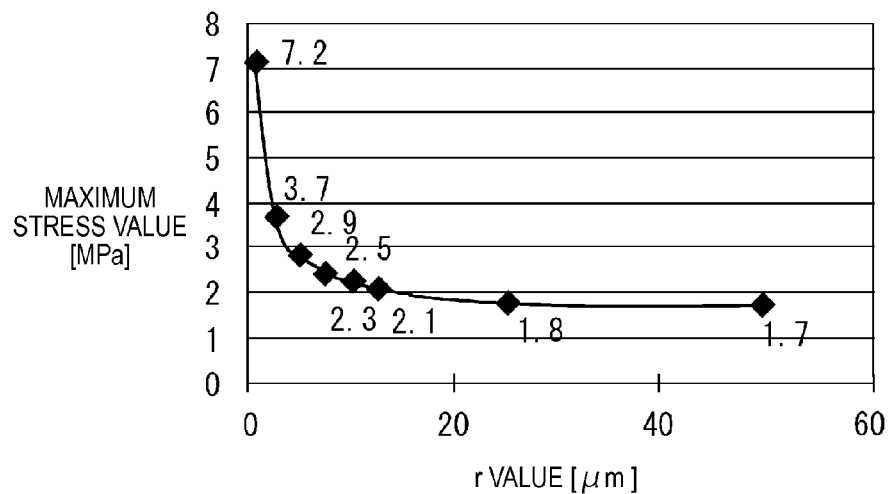
FIG. 8 is a graph where a relationship between a curvature radius of a tip portion of a dicing blade and a maximum stress value is simulated.

Next, FIG. 8 shows the relationship between a curvature radius represented on a transverse axis and a maximum stress value represented on a longitudinal axis. A graph shown in FIG. 8 represents a result of a simulation performed with respect to r=25 μm and r=50 μm in addition to the values of the curvature radius r shown in FIG. 7. A tip shape having a curvature radius r exceeding 12.5 μm, such as 25 μm or 50 μm, which causes a semicircular shape in which the degree of taper increases as shown in FIG. 5D, for example. From the same graph, as the curvature radius r decreases, that is, as the tip shape comes close to the rectangular shape, the maximum stress value increases, and the degree of change in the maximum stress with respect to the change of the curvature radius r also rapidly increases. Contrarily, it can be understood that if the curvature radius r increases, the maximum stress value decreases, the degree of change in the maximum stress with respect to the change of the curvature radius r slows down from the curvature radius of about 5 μm, and in a range where the curvature radius is 12.5 μm to 50 μm, that is, in a range of a tapered shape that does not have the top surface as shown in FIG. 6D or FIG. 5D, the change of the maximum stress value is almost uniform.

Figure 9A:
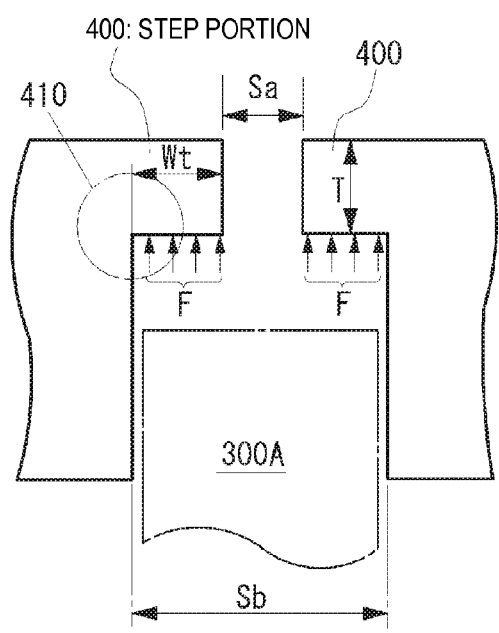
FIG. 9A is a cross-sectional view illustrating stress applied to a corner portion of a step portion.
Figure 9B:
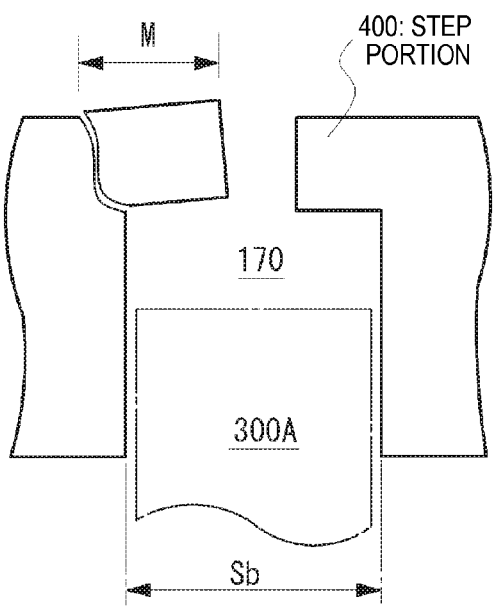
FIG. 9B is a cross-sectional view illustrating an example in which a step portion is broken due to stress generated in a corner portion of the step portion.

A mechanism that the semiconductor piece is broken will be described with reference to FIGS. 9A and 9B and FIGS. 11A and 11B based on the above simulation result. As shown in FIG. 9A, when the tip portion has a rectangular shape (when the value of the curvature radius r is extremely small) like the dicing blade 300A, the substrate is pressed by the top surface 340 of the dicing blade 300A when the groove 170 having the kerf width Sb from the rear surface of the semiconductor substrate is formed. A force F due to the dicing blade 300A is applied to the entirety of a step portion 400, but it is considered that the force F applied to the step portion 400 concentrates on a region (root region 410) of a root side of the step portion 400 by the principle of leverage. Further, when the stress concentrated on the root region 410 exceeds a breakage stress of the wafer, as shown in FIG. 9B, breakage (fragmenting, cracking, picking, or the like) occurs in the root region 410 of the step portion 400. If the breakage occurs in the step portion 400, a margin M for cutting the step portion 400 should be secured, which means that the space S of the cutting regions 120 should be equal to or larger than the margin M. From the simulation result in FIG. 8, when comparing a case where r=0.5 with a case where r=12.5, the stresses applied to the root region 410 of the step portion 400 are different from each other by approximately four times. This means that in a range where the value of the curvature radius r is smaller than that of the semicircular tip portion as shown in FIG. 5B or FIG. 6D, that is, in a range of the tip portion having the top portion, the stress applied to the root region 410 of the step portion 400 greatly varies due to the value of the curvature radius r of the tip corner portion thereof. Here, the "root region" in the present embodiment represents, when the step portion parallel to the substrate surface is formed by using the tip shape having the top surface as shown in FIGS. 5C, 5F, and 5G, a region on a side closer to the vertical side surface of the groove 170 on the rear surface side, with reference to the position of ½ of the width Wh of the step portion parallel to the substrate surface, formed on both sides of the groove on the front surface side. Further, when the tapered tip shape that does not have the top surfaces, as shown in FIGS. 5B, 5D, and 5E is used, for example, and when the step portion parallel to the substrate surface is not formed, the region represents a region on a side close to the vertical side surface of the groove 170 on the rear surface side with reference to the position of ½ of the width Wt of the step portion. The relationship between the width Wh and the width Wt is shown in FIG. 6B.

Figure 10:
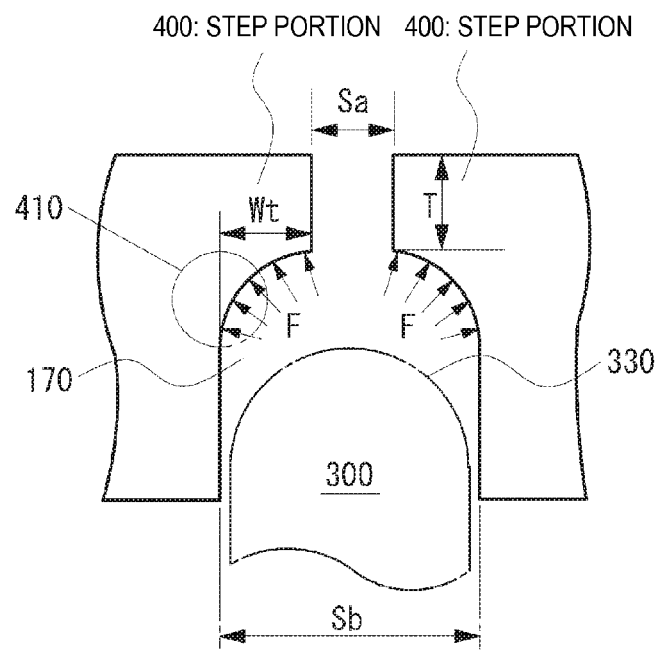
FIG. 10 is a diagram illustrating stress of a step portion when the dicing blade in FIG. 5B is used.

FIG. 10 is a cross-sectional view illustrating application of stress to the step portion 400 when the groove 170 is formed by the dicing blade 300 of the present embodiment shown in FIG. 5B. FIG. 10 shows an example in which the tip portion of the dicing blade 300 has a semicircular shape. In this case, the shape of the groove 170 similarly has a semicircular shape. As a result, the force F applied to the step portion 400 by the tip portion of the dicing blade 300 is distributed in a direction along the semicircle of the groove. Accordingly, it is considered that the concentration of the stress on the root region 410 of the step portion 400, as shown in FIG. 9A, is suppressed in the step portion 400, and fragmenting or cracking of the step portion 400 is thus suppressed.

B-2) Simulation Relating to Positional Shift

Next, a positional shift amount of a dicing blade in a groove width direction will be described.

Figure 11A:
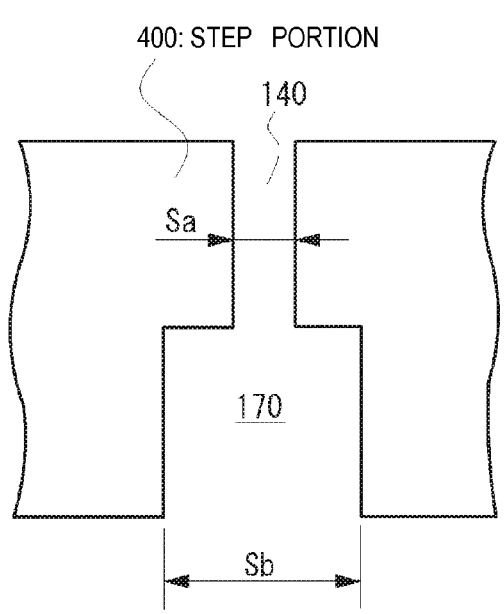
FIG. 11A is a cross-sectional view illustrating a step portion when the center of a groove 140 and the center of a groove 170 match each other.
Figure 11B:
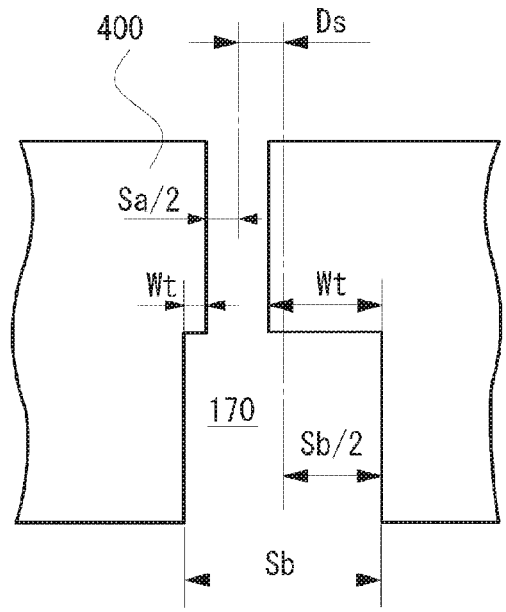
FIG. 11B is a cross-sectional view illustrating a step portion when the center of the groove 140 and the center of the groove 170 are deviated from each other.

FIGS. 11A and 11B are diagrams illustrating a positional relationship between the width Sa of the groove 140 on the front surface side formed on the front surface of the substrate and the kerf width Sb of the groove 170 formed by the dicing blade. The center of the kerf width Sb ideally matches the center of the width Sa of the groove 140 on the front surface side as shown in FIG. 11A. However, actually, the center of the kerf width Sb is deviated from the center of the width Sa of the groove 140 on the front surface side as shown in FIG. 11B, due to variation in manufacturing. Further, as a result of the positional shift, a difference occurs in the widths Wt of the right and left step portions 400. The difference between the center of the width Sa of the groove 140 on the front surface side and the center of the kerf width Sb is referred to as a positional shift amount Ds. The variation in manufacturing is appropriately based on the accuracy of the manufacturing apparatus to be used, and for example, the accuracy of the manufacturing apparatus is determined by the processing accuracy of the dicing apparatus, the accuracy of detection means (camera or the like) for detecting the position of the groove 140 on the front surface side, or the like.

Next, a simulation performed for detecting the relationship between the positional shift amount Ds of the dicing blade in the groove width direction and the stress applied to the step portion 400, and a simulation performed for detecting the relationship between the kerf width Sb of the dicing blade and the stress applied to the step portion 400 will be described. In the simulations, the kerf width Sb (μm) at the position of 12.5 μm from the top portion of the dicing blade is set as four types of Sb=25, Sb=20.4, Sb=15.8, and Sb=11.2, and the stress values when the positional shift amount Ds (μm) with respect to the groove 140 on the front surface side is changed into Ds=0, Ds=2.5, and Ds=7.5 with respect to the respective kerf widths are calculated by simulations. The tip shapes used in the current simulation are different from the tip shape used in the simulation relating to FIGS. 6A to 6D, but are common thereto in that the simulation is performed using plural tip shapes having different degrees of taper. It is assumed that the substrate which is the processing target is a GaAs substrate. Further, the thickness of the dicing blade is set to 25 µm, the curvature radius of the tip corner portion is set to r=5 µm, the width Sa of the groove 140 on the front surface side of the semiconductor substrate is set to 5 µm, and the thickness T of the step portion 400 is set to 40 µm. Further, the setting is performed so that a total load of 10 mN is applied in a normal direction of the side surfaces of the step portion 400 and the groove 170 on the rear surface side. The load of the groove 170 on the rear surface side to the side surfaces thereof is obtained in consideration of transverse vibration of the dicing blade in actual cutting.

Figure 12A:
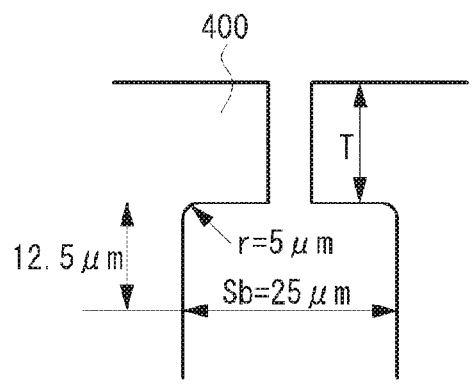
FIGS. 12A to 12D are diagrams illustrating four types of dicing blades used in a simulation relating to positional shift.
Figure 12B:
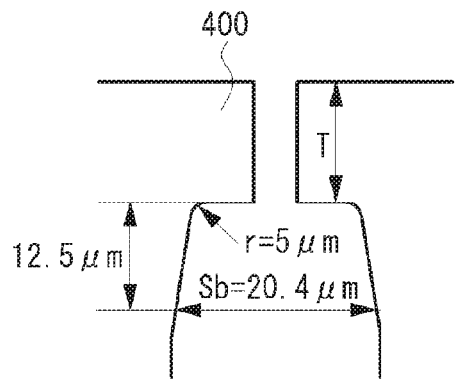
Figure 12C:
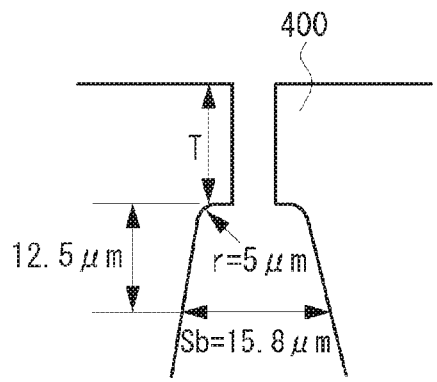
Figure 12D:
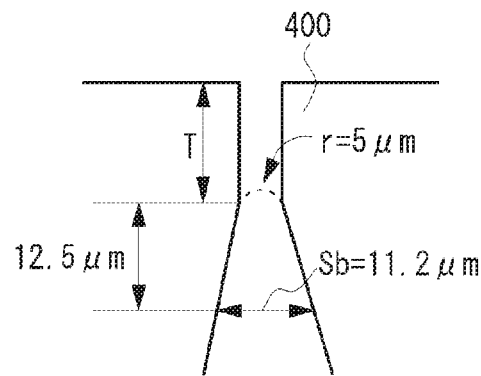

FIGS. 12A to 12D show shapes when the positional shift amount Ds is zero with respect to four types of kerf widths (tip shapes of the dicing blade) used in the simulation. FIG. 12A shows a shape when Sb=25 µm, FIG. 12B shows a shape when Sb=20.4 µm, FIG. 12C shows a shape when Sb=15.8 µm, and FIG. 12D shows a shape when Sb=11.2 µm. In any shape, a linear shape is formed on the surfaces other than the curved surface of the tip corner portion. In a case where Sb=11.2 µm as shown in FIG. 12D, the curvature radius in the region of the top portion is set to 5 µm as shown in the figure, and the tip corner portion is not provided.

Figure 13:
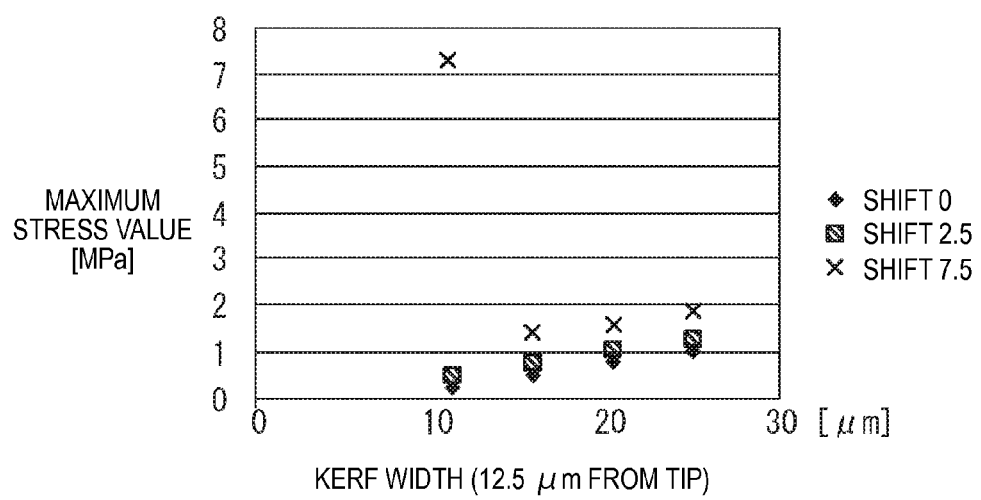
FIG. 13 is a graph illustrating a simulation result of the influence of a positional shift amount and a kerf width on a step portion.

FIG. 13 shows a simulation result of the influence of the positional shift amount Ds and the kerf width Sb on the step portion. A longitudinal axis represents a maximum stress value applied to the step portion 400, and a transverse axis represents the kerf width Sb. The kerf width Sb on the transverse axis represents a width from the top portion of the dicing blade to the position of 12.5 µm, and the positional shift amount Ds (µm) is set to Ds=0, Ds=2.5, and Ds=7.5, respectively. FIG. 13 shows a graph obtained by plotting simulation results in this case.

As obvious from the graph of FIG. 13, in any kerf width Sb, it can be understood that as the positional shift amount Ds of the dicing blade in the groove width direction increases, the maximum stress applied to the step portion 400 increases. Further, although not shown in FIG. 13, the maximum stress is generated in the root region 410 on a side where the width Wt of the step portion 400 increases due to the positional shift of the dicing blade. It is considered that this is because as the positional shift Ds increases, larger stress is easily applied to the root region 410 of the step portion 400 on the side where the step difference increases by the principle of leverage.

Further, as the kerf width Sb becomes narrow (as the degree of taper becomes large), the maximum stress value tends to decrease, but it is considered that this is because the stress does not easily concentrate on the root region 410 of the step portion 400 since the stress that presses the step portion 400 toward the front surface of the substrate is weakened as the degree of taper becomes large. Further, when the kerf width Sb is extremely narrow (Sb=11.2) and the positional shift amount Ds is large (Ds=7.5 µm), it can be understood that a place where the maximum stress value is generated is rapidly changed and the stress value (about 7.2) increases. It is considered that this is because the stress is given to the step portion 400 on a wide surface in a dicing blade having a wide kerf width Sb (dicing blade with a small degree of taper), but the stress concentrates on the region of the tapered top portion (top point) when the top portion (top point) is deviated from the range of the groove 140 on the front surface side of the semiconductor substrate in a dicing blade having an extremely narrow kerf width Sb (dicing blade with an extremely large degree of taper). Although not shown in FIG. 13, according to the simulation result, the maximum stress when the kerf width Sb is extremely narrow (Sb=11.2) and the positional shift amount Ds is large (Ds=7.5 µm) is generated in a top portion (top point) region. The position is indicated by P in FIG. 14. The "top portion region" in the present embodiment is a region including the top portion, and is a region on the center side of the groove on the rear surface side with reference to the root region 410 of the step portion 400.

B-3) Description of First Experimental Result

Figures 14, 15, 16:
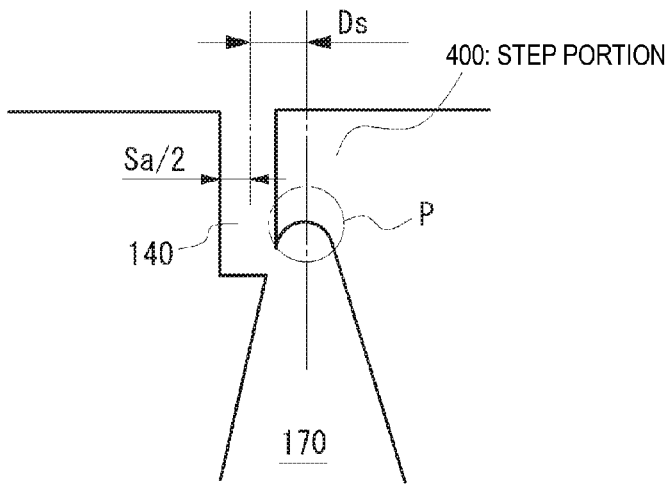
FIG. 14 is a diagram illustrating a position where a maximum stress is generated when a kerf width Sb is extremely narrow and a positional shift amount Ds is large.
FIG. 15 is a diagram illustrating an experimental result when an actual substrate is cut by various dicing blades having different kerf widths Sb and different curvature radii of a tip angle.
FIG. 16 is a diagram illustrating an experimental result performed for confirming an influence on breakage of a step portion due to a difference of widths of the groove on a front surface side and an influence on breakage of a step portion due to a difference of thicknesses of the step portion.

Next, an experimental result when plural dicing blades having different degrees of taper are prepared and an actual substrate is cut is shown in FIG. 15. In this experiment, a tip of a dicing blade having a thickness of 25 µm is processed to prepare plural dicing blades in which a curvature radius r of a tip corner portion is 1 µm to 23 µm and a kerf width at a position of 5 µm from a top portion is in a range of 5 µm to 25 µm. Specific combinations of the curvature radius and the kerf width are as shown in FIG. 15. In this preparation, the degrees of taper of the plural dicing blades are approximately the same. Further, a GaAs substrate is used, the thickness of the groove 140 on the front surface side is set to about 5 µm, the thickness T of the step portion 400 is set to about 40 µm, and the positional shift amount Ds of the dicing blade in the groove width direction is set to be less than ±7.5 µm. Since the thickness of the dicing blade is 25 µm, a tapered shape is formed in which the tip portion does not have the top surface in a range where the curvature radius r of the tip corner portion is equal to or greater than 12.5 µm. On the other hand, in a range where the curvature radius is smaller than 12.5 µm, the degree of taper decreases as it becomes small. When the curvature radius is 1 µm, an approximately rectangular tip shape is formed.

"○" in FIG. 15 represents that the degree of taper sufficiently suppresses the breakage of the step portion 400 and is usable in a mass production process, and "X" represents that the degree of taper does not sufficiently suppress the breakage of the step portion 400 and is not usable in the mass production process. In FIG. 15, in both of a range where the degree of taper is small (the curvature radius r is equal to or smaller than 8 µm) and a range where the degree of taper is large (the curvature radius r is equal to or greater than 22 µm), unusable ranges are present, but an appropriate taper range is present between both of the ranges. This is because as shown in the previous simulation result, in the range where the degree of taper is small, the stress concentrates on the root region 410 of the step portion 400 to cause the breakage of the step portion 400, and in the range where the degree of taper is large, the stress concentrates on the position of the top portion (top point) of the dicing blade to cause the breakage of the step portion 400. A range where the curvature radius r is equal to or smaller than 8 µm is a range where the step portion is broken since the degree of taper is small, and a range where the curvature radius r is equal to or greater than 22 µm is a range where the step portion is broken since the degree of taper is large.

As shown in the simulation of FIG. 8, the maximum stress applied to the step portion 400 is extremely rapidly changed according to the degree of taper of the tip portion. Accordingly, even if the breakage occurs when the rectangular tip shape or other arbitrary tip shapes are used, as shown in the experiment of FIG. 15, an appropriate degree of taper may be confirmed. It can be understood that, if the tip shape is managed to be included in the range, the breakage of the step portion is suppressed at a level such that there is no problem in the mass production process, without changing a manufacturing condition such that the thickness T of the step portion 400 increases (the width of the groove 140 on the front surface side is widened and deepened) so as to increase the strength of the step portion.

B-4) Description of Second Experimental Result

Next, an experimental result performed for confirming an influence on breakage of a step portion due to a difference of groove widths on a front surface side and an influence on breakage of a step portion due to a difference of thicknesses of the step portion is shown in FIG. 16. In this experiment, a GaAs substrate is used, and dicing blades in which the thicknesses T of the step portion 400 are 25 μm and 40 μm and the kerf width at the position of 5 μm from the tip portion is 16.7 μm are used. Further, for each width Sa of the groove 140 on the front surface side, and for each thickness T of the step portion 400, which degree of positional shift the breakage of the step portion 400 is suppressed at so that the usability in the mass production process is secured is confirmed with respect to the positional shift of the dicing blade in the groove width direction. "A" to "D" in FIG. 16 show ranges of the positional shift amount Ds in which the result that the breakage of the step portion 400 is sufficiently suppressed is obtained.

For example, a case where the thickness T of the step portion is 25 μm and the width Sa of the groove on the front surface side is 7.5 μm corresponds to "B". This shows that even a case where the dicing blade varies in a range of ±5 μm to smaller than ±7.5 μm in the groove width direction satisfies a condition that the breakage of the step portion 400 is sufficiently suppressed to be usable in the mass production process, and shows that the breakage of the step portion 400 is not sufficiently suppressed in the positional shift of ±7.5 μm or greater. Further, a case where the thickness T of the step portion 400 is 45 μm and the width Sa of the groove on the front surface side is 5 μm corresponds to "A". This shows that even a state where the dicing blade varies by ±7.5 μm or greater in the groove width direction satisfies the condition that the breakage of the step portion 400 is sufficiently suppressed to be usable in the mass production process. Further, a case where the thickness T of the step portion 400 is 25 μm and the width Sa of the groove on the front surface side is 5 μm corresponds to "D". This shows that only when the shift of the dicing blade in the groove width direction is smaller than ±3 μm, the breakage of the step portion 400 is sufficiently suppressed, and when the shift is ±3 μm or greater, the breakage of the step portion 400 is not sufficiently suppressed.

The experimental result of FIG. 16 shows that the step portion 400 is strong against the positional shift of the dicing blade in the groove width direction as the width Sa of the groove 140 on the front surface side is large. That is, as the width Sa of the groove 140 on the front surface side is wide, the step portion 400 is not easily broken due to the stress from the dicing blade. It is considered that this is because the principle of leverage hardly works since the width W of the step portion 400 is narrow as the width Sa of the groove 140 on the front surface side is wide. Further, this means that when the thickness T of the step portion 400 is large, the step portion 400 is strong against the positional shift of the dicing blade in the groove width direction. That is, when the thickness T of the step portion 400 is large, the step portion 400 is not easily broken due to the stress from the dicing blade. This is because when the thickness T of the step portion 400 is large, the step portion 400 has a strong strength against the stress.

C) Design Method of Tip Portion

Next, a design method of a tip shape of a dicing blade and a semiconductor chip manufacturing method based on the above-mentioned simulations and experimental results will be described. As long as there is no particular mention, the following embodiments are premised on the manufacturing flow of the embodiment shown in FIG. 1.

Figure 17:
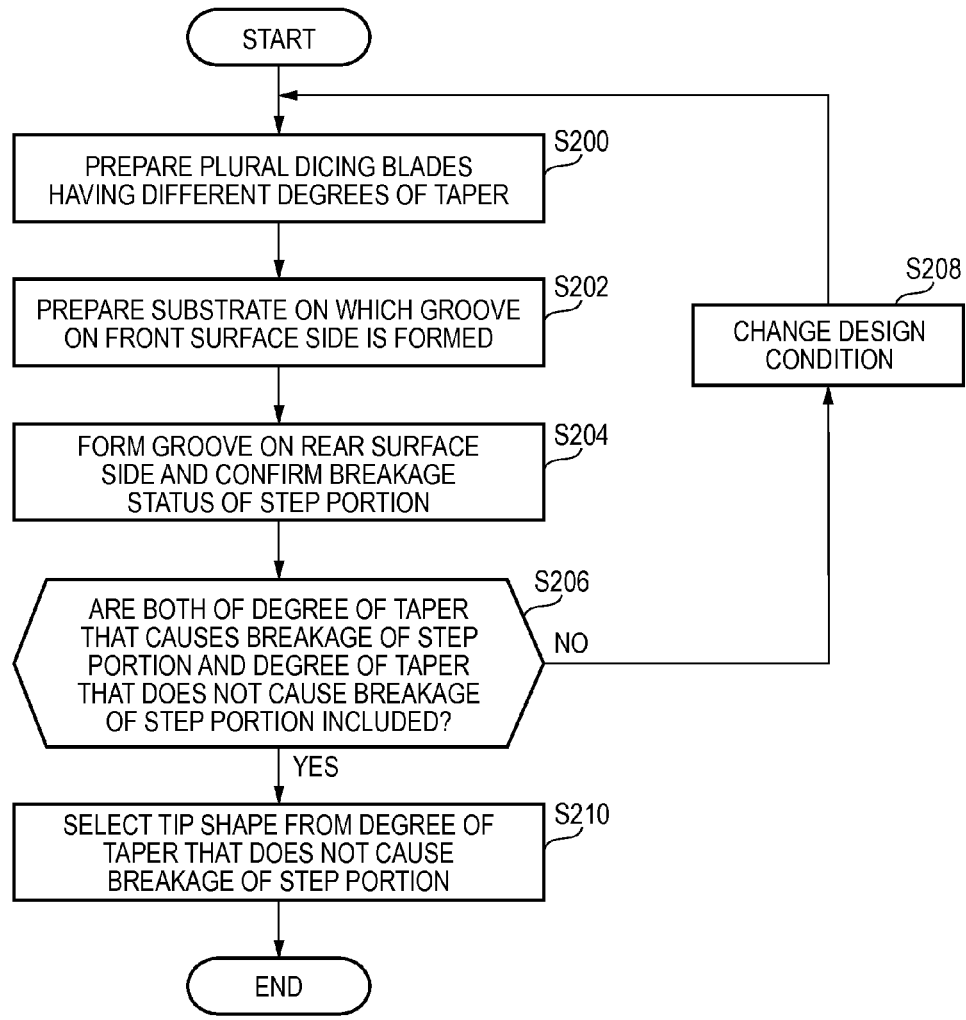
FIG. 17 is a flowchart illustrating a design method of a tip shape of a dicing blade used in a semiconductor piece manufacturing method according to an embodiment of the invention.

FIG. 17 is a flowchart illustrating a design method of a tip shape of a dicing blade used in a semiconductor piece manufacturing method according to an embodiment of the invention. A series of processes in FIG. 17 may be performed using an actual semiconductor substrate, or may be performed using a simulation without using the actual semiconductor substrate.

In the flow of FIG. 17, first, in step S200, plural dicing blades having different degrees of taper of tip shapes are prepared. For example, as in the experiment shown in FIG. 15, plural dicing blades are prepared so that the degrees of taper vary at predetermined intervals. Here, a tip shape used in full dicing that is a general dicing method is the rectangular shape as shown in FIG. 5G. Accordingly, in order to prepare the plural dicing blades having different degrees of taper using the rectangular dicing blade, it is necessary to process the rectangular shape in advance. For example, by being supplied with plural dicing blades having rectangular shapes, and then, by actually dicing a member for tip processing such as a dummy wafer, an abrasion degree of the tip shape due to cutting may vary for each dicing blade. A method of tapering the dicing blade will be described later in detail.

In S200, the plural dicing blades having different degrees of taper may be prepared by being supplied from a different subject without performing the processing of the tip shape. Further, S200 may be replaced with a process of preparing plural dicing blades having different degrees of stress applied to the root region 410 of the step portion 400. Further, it is not necessary to collectively perform the preparation of the dicing blades, and for example, a method in which one type of degree of taper is prepared, the operations up to S204 to be described later are performed, different degrees of taper are prepared, and then, the operations up to S204 are performed again may be used.

The "degree of taper" in the present embodiment is determined by the curvature radius of the tip corner portion of the dicing blade, the curvature radius of the top portion (top point), the thickness of the blade at a predetermined distance from the top portion, or the like. For example, as the curvature radius of the tip corner portion is large, and as the curvature radius of the top portion (top point) is small, the degree of taper increases. In addition, as the thickness of the blade at the predetermined distance from the top portion is small, the degree of taper increases. In other words, the degree of taper may be expressed as the thickness of the blade at the predetermined distance from the top portion. Further, when the dicing blade is abraded and the thickness of the tip portion becomes thin, the degree of taper also increases. In other words, the degree of taper may be expressed as the degree of stress to the root region 410 of the step portion 400. That is, as the degree of taper increases, the degree of stress to the root region 410 of the step portion 400 decreases. As long as there is no particular mention, the degree of taper refers to the degree of taper in a shape on the tip side from the top portion of the dicing blade to a distance which is about two times the thickness of the dicing blade.

Next, in S202, in order to confirm a breakage status of the step portion when the plural dicing blades prepared in S200 are used, a semiconductor substrate having plural grooves of the same shape as grooves on a front surface side, which is expected to be employed in a mass production process, is prepared. The pitch of the grooves on the front surface side may be a pitch which is expected to be employed in the mass production process, or may be another pitch. That is, it is sufficient if the breakage status of the step portion in the mass production process can be estimated for each degree of taper. Further, in S202, the semiconductor substrate may be prepared by forming the grooves on the front surface side with respect to the semiconductor substrate on which the grooves are not formed in a similar way to the case of S104 in FIG. 1, or may be prepared by being supplied with the semiconductor substrate on which the grooves are formed from another subject without performing the formation of the groove. Here, the "substantially the same shape" means a shape including production tolerance or the like generated when the grooves are formed to have the same shape.

Next, in S204, the groove 170 on the rear surface side is formed with respect to the semiconductor substrate prepared in S202 using each of the plural dicing blades prepared in S200. Further, the breakage status of the step portion when each of the plural dicing blades is used is confirmed. Specifically, the presence or absence of cracking, fragmenting, or the like in the vicinity of the step portion, and the degree thereof are confirmed using a microscope or the like. In order to specify the degree of taper (shape in which the breakage is suppressed to such a degree as to be usable in the mass production process) that does not cause the breakage of the step portion, it is preferable to perform the formation of the groove on the rear surface side and the confirmation of the breakage status plural times with respect to the respective tip shapes. Further, it is preferable to perform the formation and the confirmation under the positional shift condition so that the step portion is easily broken, in consideration of the positional shift of the dicing blade. Further, as a result of the confirmation, for example, as shown in FIG. 15, each degree of taper and whether the degree of taper causes the breakage of the step portion (whether the degree of taper is usable in the mass production process) are listed.

Next, in S206, it is confirmed whether both of the degree of taper that causes the breakage of the step portion and the degree of taper that does not cause the breakage of the step portion are included in the plural dicing blades prepared in S200. For example, since the case of FIG. 15 includes the degree of taper that causes the breakage of the step portion and the degree of taper that does not cause the breakage of the step portion (YES in S206), the procedure proceeds to S210. The case where the both degrees of taper are included in this way means that at least a part of a taper range usable in the mass production process and at least a part of a taper range unusable in the mass production process can be specified. For example, when the step portion is broken when the degree of taper is small and is not broken when the degree of taper is large, it is possible to estimate that when the degree of taper is small, the breakage occurs due to stress to the root region of the step portion, and accordingly, it is possible to determine that the range where a taper range having a degree of taper smaller than the small degree of taper is an unusable taper range. Further, it is possible to determine that the degree of taper that does not cause the breakage of the step portion is at least a usable degree of taper. Contrarily, when the step portion is broken when the degree of taper is large and is not broken when the degree of taper is small, it is possible to estimate that when the degree of taper is large, the step portion is broken due to concentration of stress to the region of the tapered top portion, and accordingly, it is possible to determine that a taper range having a degree of taper larger than the degree of taper thereof is an unusable taper range. Further, it is possible to determine that the degree of taper that does not cause the breakage of the step portion is at least a usable degree of taper. In S206, the case where both of the degree of taper that causes the breakage of the step portion and the degree of taper that does not cause the breakage of the step portion are included in this way means that when a dicing blade having an arbitrary tip shape is used, there is a possibility that the step portion is broken, and at least a part of a taper range usable in the mass production process and a taper range unusable in the mass production process can be specified with respect to the grooves on the front surface side which are narrow and shallow.

On the other hand, when the step portion is broken in all the degrees of taper prepared in S200, this means that the degree of taper usable in the mass production process cannot be specified at all. Accordingly, in this case (NO in S206), the procedure proceeds to S208. Further, when the step portion is not broken in all the degrees of taper, since the groove on the front surface side is unnecessarily wide and deep, consequently, there is a possibility that the manufacturing condition is not appropriate. For example, the strength of the step portion may be unnecessarily strongly set. Accordingly, in this case, the procedure proceeds to S208.

In S208, for example, a setting condition such as a shape (width, depth, or the like) of the groove 140 on the front surface side is changed. According to the experimental result in FIG. 16, as the depth of the groove 140 on the front surface side is shallow, and as the width Sa of the groove 140 on the front surface is narrow, the strength of the step portion becomes weak to be easily broken. That is, it is considered that, when the step portion is broken in all the degrees of taper prepared in S200, the groove 140 on the front surface side is excessively shallow or excessively narrow to excessively weaken the strength of the step portion. Accordingly, in this case, the strength of the step portion is strengthened by changing the shape of the groove 140 on the front surface side. Specifically, at least one of widening of the width Sa of the groove 140 on the front surface side and deepening of the depth thereof is performed.

Further, according to the simulation results in FIGS. 12A to 13, as the positional accuracy of the dicing blade in the groove width direction when the groove 140 on the rear surface side is formed is low, the step portion is easily broken. Accordingly, the manufacturing condition that affects the positional accuracy may be changed so that the positional accuracy of the dicing blade in the groove width direction becomes high. For example, the dicing apparatus may be changed to a dicing apparatus with more excellent positional accuracy of a dicing blade. In this way, by changing at least one of the shape of the groove 140 on the front surface side and the positional accuracy of the dicing blade in the groove width direction, the manufacturing condition is changed to a condition that the step portion is not easily broken.

Further, when the step portion is not broken in all the degrees of taper prepared in S200, since the groove 140 on the front surface side is unnecessarily wide and deep, consequently, it is considered that the strength of the step portion is unnecessarily strongly set. In this case, by changing the width of the groove to become narrow, there is a possibility that the number of semiconductor pieces capable of being acquired from one semiconductor substrate can increase. If the width of the groove becomes narrow, a deep groove is not easily formed, or the strength of the step portion is weakened. However, as shown in FIG. 8, since the stress is greatly changed due to the degree of taper, by specifying the appropriate degree of taper, it is possible to form the groove 170 on the rear surface side without breaking the step portion even with respect to the groove 140 on the front surface side which is narrow and shallow. Accordingly, in S206, when the step portion is not broken in all the prepared degrees of taper, by changing the groove 140 on the front surface side to become narrow (or narrow and shallow), the design condition is set so that the number of semiconductor pieces capable of being acquired from one semiconductor substrate increases, the flow is performed from S200 again, and the flow from S200 to S208 is repeated until the flow reaches S210. As described above, if the groove 140 is narrow, a deep groove is not easily formed. This is because, for example, when the groove 140 on the front surface side is formed by dry etching, the groove is narrow, an etching gas does not easily enter the deep inside of the groove, and the progress of etching at the bottom portion of the groove is disturbed. Further, this is because when the groove is formed by a thin dicing blade, the blade is easily broken.

For example, when the types of dicing blades prepared in S200 is small, and when the degrees of taper are biased to be excessively large or excessively small, in S206, a state where both of the degree of taper that causes the breakage of the step portion and the degree of taper that does not cause the breakage of the step portion are included is not easily obtained. Accordingly, in such a case, the designing condition in S208 may be changed so that the types of tip shapes prepared in S200 increases.

As described above, the design condition is changed in S208, and the flow is performed from S200 again. Further, until the flow reaches S210, the flow from S200 to S208 is repeated.

In S210, an initial tip shape of the dicing blade to be used in the mass production process is selected from the degrees of taper that do not cause the breakage of the step portion. Further, the degrees of taper that cause the breakage of the step portion are naturally excluded from the selection target so as not to be used in the mass production process. That is, the degrees of taper that cause the breakage of the step portion are excluded from a selection target range. The same degree as the degree of taper used in the experiment is not necessarily selected as the tip shape to be used in the mass production process, and a taper range that does not cause the breakage of the step portion may be estimated and the degree of taper included in the estimated range may be selected. For example, in the experimental result in FIGS. 11A and 11B, a range where the curvature radius r of the tip corner portion is 13 μm to 21 μm is estimated as the taper range that does not cause the breakage of the step portion, a tip shape corresponding to the curvature radius r of 14.5 μm or 18.5 μm is selected as the initial tip shape of the dicing blade to be used in the mass production process, and the curvature radius r of the tip corner portion is managed so as not to deviate from the range of 13 μm to 21 μm through the mass production process. That is, when the number of the degrees of taper that do not cause the breakage of the step portion, a range between the plural degrees of taper may be estimated as a taper range that does not cause the breakage of the step portion, and the tip shape may be selected from the range.

Here, it is preferable that a tip shape of a degree having a degree of taper smaller than the degree of taper of the center of the range, in the taper range that does not cause the breakage of the step portion, is selected as the initial tip shape of the dicing blade to be used in the mass production process. For example, in the experimental result of FIG. 15, a tip shape in which the curvature radius r of the tip corner portion is 17 μm to 21 μm is not selected, but instead, a tip shape in which the curvature radius r of the tip corner portion is 13 μm to 17 μm is selected. This is because when the degree of taper is small, the tip portion is in a state where the tip portion is not abraded compared with a case where the degree of taper is large, that is, the lifespan of the dicing blade is long. Further, when the tip shape is processed using the general rectangular dicing blade, a time period when the rectangular shape is processed in advance into a desired degree of taper becomes short.

Further, when the degree of taper that causes the breakage of the step portion is present on a side where the degree of taper is larger than the degree of taper thereof that does not cause the breakage of the step portion, it is preferable that the degree of taper is managed in the mass production process so as not to reach such a degree of taper due to abrasion of the tip portion of the dicing blade. For example, in FIG. 15, on a side where the curvature radius of the tip corner portion is larger (range that exceeds 21 μm) than 13 μm to 21 μm that are the degrees of taper that do not cause the breakage of the step portion, the degrees of taper of 22 μm to 23 μm that cause the breakage of the step portion are present. Accordingly, in the case of the experimental result of FIG. 15, it is preferable that the degree of taper is managed in the mass production process so that the curvature radius of the tip corner portion does not exceed 21 μm due to abrasion of the tip portion of the dicing blade. Specifically, it is preferable that the dicing blade is exchanged before the curvature radius reaches the above-mentioned degree of taper. The "exchange" in the present embodiment does not only include exchange into a completely different dicing blade, but also includes re-processing (dressing) of the tip shape of the same dicing blade.

Hereinbefore, the flow of the design method of the tip shape of the dicing blade according to the present embodiment has been described, but according to this design method, when the tip shape of the dicing blade to be used in the mass production process is determined, it is possible to employ the groove 140 on the front surface side which is shallow, compared with a case where the tip shape is determined without considering the relationship between the degree of taper of the tip shape and the breakage of the semiconductor piece. In the related art, when fine grooves having widths of several micrometers to several tens of micrometers communicate with each other, any breakage occurrence and a cause thereof are not obvious, and thus, it is difficult to employ the manufacturing process shown in FIG. 1 in the actual mass production process. Further, even when the manufacturing process shown in FIG. 1 is employed, unnecessary wide and deep grooves are formed on the front surface side. On the other hand, in the design method of the tip shape of the dicing blade according to the present embodiment, as shown in FIG. 7 or FIG. 8, and plural dicing blades having different degrees of taper are prepared in S200 in FIG. 17, in consideration of the fact that the stress of the step portion is greatly changed by the degree of taper. Further, in S206 in FIG. 17, since the tip shape is selected only when both of the degree of taper that causes the breakage of the step portion and the degree of taper that does not cause the breakage of the step portion are included, while labor in design is necessary, the groove 140 on the front surface side which is narrow and shallow can be employed in the mass production process compared with a case where a dicing blade having an arbitrary tip shape is used.

Next, a specific method of preparing the plural degrees of taper in S200 in FIG. 17 will be described. First, as a dicing blade that cuts a compound semiconductor made of GaAs or the like, a diamond blade, a blade obtained by integrating a diamond blade and an aluminum base, or the like may be used. Generally, the tip of such a dicing blade that is available on the market or the like forms a rectangular shape in which a curved surface is not formed in a tip portion thereof, like the shape of FIG. 5G. Thus, in order to use the dicing blade that does not form the desired shape, like the rectangular shape, it is necessary to process the tip portion.

The processing includes the following processes, for example. That is, a dicing blade that is available on the market or the like is prepared, and a material for processing the tip portion of the prepared dicing blade is selected. For example, a processing substrate made of Si, SiC or another compound semiconductor material is selected. Any material that can process the tip portion into a desired shape may be used.

Next, by repeating cutting of the processing semiconductor substrate using the dicing blade, the tip portion comes close to a desired shape while being abraded. In order to obtain the desired curved surface shape, an angle formed by the processing substrate and the dicing blade, a rotational speed of the dicing blade, a grinding time, an abrasive, or the like can be appropriately selected. In this way, before the dicing process, the dicing blade is processed into a desired tapered shape using the processing material prepared for processing of the tip portion. With such a method, even the rectangular dicing blade used in the general full dicing can be commonly used as the dicing blade prepared in S200 in FIG. 17.

Next, in S200 in FIG. 17, what degree of taper the tip shape to be prepared should have will be described in detail.

As a first aspect, it is preferable to include at least one type of a tapered dicing blade compared with a dicing blade having a semicircular tip portion. In other words, it is preferable to include at least one type of dicing blade having the degree of taper in which the maximum stress to be generated in the root region of the step portion is small compared with the dicing blade having the semicircular tip portion. In this regard, as understood from FIG. 8, in a range (range exceeding r=12.5 μm) where the tip portion is tapered compared with the dicing blade having the semicircular tip portion, the maximum stress is saturated at a low level. That is, by preparing at least one type of dicing blade having the degree of taper in this range, it is possible to check whether the step portion is broken under a condition close to the condition that the maximum stress to the root region becomes smallest. Thus, for example, when the step portion is broken, in S208, it is easily determined that it is necessary to change the width or depth of the groove 140 on the front surface side so that the step portion is not easily broken, without changing the design condition so that the types of the tip shapes to be prepared increase.

As a second aspect, it is preferable to include a dicing blade of which the tip portion has a small degree of taper compared with the dicing blade having the semicircular tip portion, in addition to the tapered dicing blade compared with the dicing blade having the semicircular tip portion. In other words, it is preferable to include dicing blades of both of the degree of taper in which the maximum stress generated in the root region of the step portion is small and the degree of taper in which the maximum stress is large compared with the dicing blade having the semicircular tip portion. In this regard, as understood from FIG. 8, in the range (range exceeding r=12.5 μm) where the tip portion is tapered compared with the dicing blade having the semicircular tip portion, the maximum stress is saturated at the low level. However, in a range (range equal to or smaller than r=12.5 μm) where the tip portion has the small degree of taper compared with the dicing blade having the semicircular tip portion, the maximum stress is greatly changed. That is, by preparing dicing blades having the degrees of taper included in the respective range, a possibility that the dicing blades have the degree of taper that causes the breakage of the step portion and the degree of taper that does not cause the breakage of the step portion becomes high, and thus, in S206 of FIG. 17, the procedure easily proceeds to S210 in FIG. 17. That is, the selection of the tip shape becomes easy.

As a third aspect, it is preferable to include plural dicing blades having a small degree of taper compared with a cutting portion having a semicircular tip portion. In other words, it is preferable to include plural dicing blades having the degree of taper that generates a large stress in the root region of the step portion compared with the dicing blade having the semicircular tip portion. As understood from FIG. 8, in a range (less than r=12.5 μm) where a large stress is generated in the root region of the step portion compared with the dicing blade having the semicircular tip shape, the maximum stress with respect to the degree of taper is greatly changed compared with the taper range (r=12.5 or greater) greater than the above-mentioned range. Accordingly, by preparing plural dicing blades in the range where the maximum stress is greatly changed, it is easily confirmed what extent the degree of taper can decrease to in a range where the step portion is not broken.

As a fourth aspect, it is preferable to include three or more types of dicing blades having the small degree of taper compared with the cutting portion having the semicircular tip portion. In other words, it is preferable to include at least three types of dicing blades having the degree of taper that generates a large stress in the root region of the step portion compared with the dicing blade having the semicircular tip portion. As understood from FIG. 8, in the range (less than r=12.5 μm) where a large stress is generated in the root region of the step portion compared with the dicing blade having the semicircular tip shape, the maximum stress is greatly changed, and also, the stress is not linearly changed but nonlinearly changed. Accordingly, by using at least three types of dicing blades in the range where the stress is nonlinearly changed, it is easily confirmed what extent the degree of taper can decrease to in a range where the step portion is not broken, compared with the case of two types of dicing blades.

As a fifth aspect, it is preferable that a dicing blade to be prepared includes a dicing blade having the degree of taper in which the maximum stress is generated in the region of the top portion deviated from the width of the groove on the front surface side when the position of the top portion of the dicing blade in the groove width direction is deviated from the width of the groove on the front surface side when the groove on the rear surface side is formed, in a tapered tip shape in which the top surface is not provided in the top portion. This is because when such a dicing blade is not included, when the position of the top portion in the groove width direction is deviated from the width of the groove on the front surface side, it is not possible to reliably confirm what extent the degree of taper can increase to in a range where the step portion is not broken. Further, by including such a dicing blade in plurality, compared with a case where only one type of dicing blade is included, it is easily confirm what extent the degree of taper can increase to in a range where the step portion is not broken. When it is obvious that the top portion of the dicing blade is not deviated from the width of the groove on the front surface side, such a dicing blade may not be included.

As a sixth aspect, as shown in FIG. 15, it is preferable that the degrees of taper are prepared at approximately uniform intervals. Further, although the number of types of degrees of taper that should be prepared in S200 in FIG. 17 is at least two, in order to use the groove on the front surface side that is narrow and shallow, it is preferable to prepare as many types of degrees of taper as possible as shown in FIG. 15.

D) Embodiment Based on Relationship Between Blade Position and Width of the Groove D-1) Relationship Between Processing Accuracy and Groove on Front Surface Side Next, the relationship between the processing accuracy of the manufacturing apparatus that manufactures the semiconductor piece and the width Sa of the groove 140 on the front surface, and the design method of the tip shape of the dicing blade and the semiconductor piece manufacturing method based on the above-mentioned relationship will be described. The processing accuracy of the manufacturing apparatus not only includes the processing accuracy including the positioning accuracy or the like of the dicing apparatus, but also includes accuracies of other apparatuses to be used in the manufacturing process, for example, the detection accuracy of detection means such as a camera that detects the position of the groove 140 on the front surface side. Further, the processing accuracy of the manufacturing apparatus becomes a main factor, and on this basis, the position of the dicing blade in the groove width direction (variation range) is determined.

As described in FIG. 13, in the dicing blade having a large degree of taper, when the tapered top portion that does not have the top surface is deviated from the range of the groove 140 on the front surface side of the semiconductor substrate in the groove width direction, the stress may concentrate on the region of the top portion, and the step portion may be broken. That is, when the dicing blade having a degree of taper in which the stress concentrates on the region of the tapered top portion that does not have the top surface is used, even in the relationship between the processing accuracy of the manufacturing apparatus in which the top portion is deviated from the range of the groove 140 on the front surface side of the semiconductor substrate in the groove width direction and the width of the groove 140 on the front surface side, it is preferable that other manufacturing conditions such as the tip shape of the dicing blade, the shape of the groove 140 on the front surface side, or the like are determined so that the step portion is not broken.

On the other hand, even in the dicing blade having an extremely large degree of taper, if the relationship between the processing accuracy of the manufacturing apparatus in which the top portion is not deviated from the width of the groove 140 on the front surface side and the width of the groove 140 is satisfied, the stress applied to the step portion is not rapidly changed. That is, if the manufacturing condition that the tapered top portion that does not have the top surface is included in the width of the groove 140 on the front surface side is satisfied, even when the degree of taper is extremely large, for example, even when the curvature radius of the tip corner portion in FIG. 15 is 22 μm or 23 μm, the step portion is not broken. Contrarily, the maximum stress applied to the step portion becomes small as the degree of taper of the dicing blade is large, which is preferable in view of reduction in the maximum stress.

Further, in many cases, since the tapered top portion that does not have the top surface is normally formed at the center of the thickness of the dicing blade, the manufacturing condition that the tapered top portion that does not have the top surface is not deviated from the width of the groove 140 on the front surface side may be referred to as a manufacturing condition that a range where the center of the thickness of the dicing blade varies in the groove width direction is included in the width of the groove 140 on the front surface side. Here, the tapered top portion that does not have the top surface may be deviated from the center of the thickness of the dicing blade according to a condition when the tip shape is processed in advance or an abrasion state in an actual manufacturing process. That is, whether the tapered top portion that does not have the top surface is deviated or not deviated from the width of the groove 140 on the front surface side is also caused by deviation due to such a factor.

Accordingly, when it is necessary to determine whether the tapered top portion that does not have the top surface is deviated or not deviated from the width of the groove 140 on the front surface side, the determination is performed in consideration of the above-mentioned deviation. Here, when it is difficult to consider such a factor, the determination may be performed on the basis of the center of the thickness of the dicing blade. From the above description, the "manufacturing condition that the center of the thickness of the dicing blade is included in the width of the groove 140 on the front surface side (or is deviated from the width of the groove 140 on the front surface side)" can be expressed as the "manufacturing condition that the tapered top portion that does not have the top surface is included in the width of the groove 140 on the front surface side (or is deviated from the width of the groove 140 on the front surface side)", as long as there are neither particular mention nor technical inconsistency.

The "included" in the present embodiment also includes a case where the position of the top portion and the width of the groove completely match each other, and the processing accuracy of the manufacturing apparatus necessary for determining whether the top portion is included in or deviated from the groove 140 on the front surface side employs a value disclosed in a catalogue or the like of a product to be used. When the catalogue value is not present, a value obtained by actual measurement may be used. Specifically, the actual measurement is performed plural times, an average value and a standard deviation are calculated based on the result, and a value obtained by adding three times (3 sigmas) to four times (4 sigmas) the standard deviation to the average value is used as the processing accuracy of the manufacturing apparatus. When the processing accuracy is based on the accuracies of the plural apparatuses, a value of a square average of the accuracies of the respective apparatuses is used.

Further, as the width of the groove on the front surface side necessary for determining whether the top portion is included in or deviated from the width of the groove 140 on the front surface side, when the width of the groove on the front surface side is not uniform, the maximum width from the position of the bottom portion of the groove on the front surface side to the position which the top portion of the dicing blade reaches is used. Here, for example, when whether the top portion is included in or deviated from the width of the groove 140 on the front surface side is delicate and it is difficult to perform the determination, even if any one of an example in which it is assumed that the top portion is included therein and an example in which it is assumed that the top portion is not included therein (deviated therefrom) is employed, it is considered that a significant influence on the degree of breakage of the step portion is not present, and thus, any example may be arbitrarily selected.

D-2) when Top Portion of Blade is Included in Groove on Front Surface Side

Next, the design method of the tip portion of the dicing blade and the semiconductor piece manufacturing method based on the relationship between the position of the dicing blade in the groove width direction due to the accuracy of the manufacturing apparatus or the like and the width of the groove 140 on the front surface side will be described. First, an embodiment under the manufacturing condition that the range where the center of the thickness of the dicing blade varies in the groove width direction is included in the width of the groove 140 on the front surface side will be described.

First, as a first aspect, under the manufacturing condition that the center of the thickness of the dicing blade is included in the width of the groove 140 on the front surface side, the tip shape of the dicing blade may be designed as follows. For example, when the tip shape of the dicing blade is designed according to the flow of FIG. 17, in S200, it is not necessary to prepare a dicing blade in a range where the degree of taper is extremely large. According to the simulation result in FIG. 8, in the range where the curvature radius r is equal to or greater than 25 μm, since the maximum stress is changed only by 0.1 Mpa, it is almost meaningless to prepare a dicing blade having the degree of taper in which the curvature radius of the tip corner portion is equal to or greater than 25 μm (the curvature radius of the tip corner portion is equal to or greater than the thickness of the dicing blade). That is, the plural dicing blades to be prepared may include at least a dicing blade having the degree of taper that generates a large stress in the root region of the step portion compared with a case where the curvature radius of the tip corner portion is equal to or greater than the thickness of the dicing blade, and may not include a dicing blade having the degree of taper that generates a small stress in the root region of the step portion compared therewith.

As a second aspect, under the manufacturing condition that the range where the center of the thickness of the dicing blade varies in the groove width direction is included in the width of the groove 140 on the front surface side, the semiconductor piece may be manufactured by the following manufacturing method. For example, the taper range where the step portion is broken since the degree of taper of the tip shape of the dicing blade is small is confirmed by the flow shown in FIG. 17, and a dicing blade having a tip shape having a degree of taper larger than the range is used, and contrarily, a dicing blade having a degree of taper smaller than the range is not used. This is because under the manufacturing condition that the range where the center of the thickness of the dicing blade varies in the groove width direction is included in the width of the groove 140 on the front surface side, even if the degree of taper is large, as shown in FIG. 13, the stress applied to the step portion is not rapidly changed as in a case where the kerf width is extremely narrow (Sb=11.2) and the positional shift amount Ds is large (Ds=7.5 μm), and thus, only the range on the side where the degree of taper is small may be considered in design.

The taper range where the step portion is broken since the degree of taper is small is a range where the curvature radius of the tip corner portion is equal to or smaller than 8 μm, when referring to FIG. 15. Further, under the manufacturing condition that the range where the center of the thickness of the dicing blade varies in the groove width direction is included in the width of the groove 140 on the front surface side, when the step portion is broken accordingly as the groove on the rear surface side is formed, this means that the stress to the root region of the step portion is excessively large. Accordingly, when the step portion is broken as the groove on the rear surface side is formed at a specific degree of taper, the dicing blade in the range where the degree of taper is smaller than the specific one type degree of taper may not be used.

As a third aspect, under the manufacturing condition that the range where the center of the thickness of the dicing blade varies in the groove width direction is included in the width of the groove 140 on the front surface side, a dicing blade having a tapered shape compared with the dicing blade having the semicircular tip portion as shown in FIG. 6D is used as an initial tip shape during cutting. As understood from FIG. 8, in a range (r<12.5 μm) where the degree of taper is small compared with the semicircular tip portion (r=12.5 μm), when the degree of taper is changed, the maximum stress is greatly changed. On the other hand, in a range (r>12.5 μm) where the degree of taper is large compared with the semicircular tip portion, the maximum stress is saturated at a low level. Accordingly, if the tapered tip portion compared with the semicircular tip portion is used as the initial tip portion during cutting, a case where the dicing blade is abraded later is covered, and thus, a state where the stress to the step portion is suppressed at the low level can be maintained in the mass production process. Further, by using a region where the stress is saturated at the low level as the initial tip shape, even though the tip portion varies when preparing the initial shape, it is possible to suppress the change of the stress to the step portion, and it is easy to employ a narrow and shallow groove on the front surface side. As a result, the breakage of the step portion is suppressed compared with a case where a tip shape having a small degree of taper compared with the semicircular tip portion is used as the initial tip shape.

The dicing blade having the tapered shape compared with the dicing blade having the semicircular tip portion may be prepared by processing the rectangular dicing blade as described in S200 in FIG. 17, or may be prepared by being supplied from another subject without performing the processing of the dicing blade. Further, for example, it is confirmed whether the range where the center of the thickness of the dicing blade varies in the groove width direction is included in the width of the groove on the front surface side, and if the confirmation result is affirmative, for example, the dicing blade having the tapered shape may be determined so that a dicing blade that has in advance a tapered shape compared with the dicing blade having the semicircular tip portion is used as an initial tip shape during cutting.

As a fourth aspect, under the manufacturing condition that the range where the center of the thickness of the dicing blade varies in the groove width direction is included in the width of the groove 140 on the front surface side, the semiconductor piece may be manufactured by the following manufacturing method. For example, when the step portion has such a strength as to be broken when a dicing blade having a cross section of a rectangular tip shape seen in the rotational direction is used, the groove 170 on the rear surface side is formed by a dicing blade having a tip shape having a degree of taper larger than the taper range that causes the breakage of the step portion. In other words, in such a case, the groove 170 on the rear surface side is formed by a dicing blade having a tapered tip shape that does not apply a stress equal to or greater than the stress that causes the breakage of the step portion to the root region of the step portion. According to this manufacturing method, the semiconductor substrate can be individualized without the breakage of the step portion of the semiconductor piece due to the stress from the dicing blade, even using the narrow and shallow groove shape on the front surface side where the step portion is broken when the generally used rectangular dicing blade is used.

As understood from FIG. 8, this is an embodiment based on the consideration of both of the fact that since the stress of the step portion varies by even four or more times by the degree of taper of the tip portion, the degree of taper that does not cause the breakage of the step portion is present even using the narrow and shallow groove shape on the front surface side where the step portion is broken when the dicing blade having the rectangular tip shape is used, and the fact that under the manufacturing condition that the range where the center of the thickness of the dicing blade varies in the groove width direction is included in the width of the groove 140 on the front surface side, the stress applied to the step portion is not rapidly changed even if the degree of taper increases.

By using the tapered dicing blade compared with the semicircular tip portion or the dicing blade having the degree of taper that generates a small stress in the root region of the step portion compared with the semicircular tip portion, the region where the stress applied to the step portion is saturated at the low level, which is preferable in view of stress.

D-3) when Blade Top Portion is Deviated from Groove on Front Surface Side

Hereinbefore, the embodiment in the manufacturing condition that the range where the center of the thickness of the dicing blade varies in the groove width direction is included in the width of the groove 140 on the front surface side has been described, but an embodiment in a manufacturing condition that the range where the center of the thickness of the dicing blade varies in the groove width direction is deviated from the width of the groove 140 on the front surface side will be described.

First, as a first aspect, under the manufacturing condition that the dicing blade having the tapered tip shape that does not have the top surface on the top portion is used and the range where the top portion varies in the groove width direction is deviated from the width of the groove on the front surface side, the semiconductor piece can be manufactured by the following manufacturing method. For example, the groove on the rear surface side is formed by a dicing blade having a tip shape having a degree of taper smaller than the taper range that causes the breakage of the step portion due to the maximum stress applied to the region of the top portion. In other words, the dicing blade having such a shape is used in the mass production process.

According to such a manufacturing method, regardless of the manufacturing condition that the range where the tapered top portion that does not have the top surface varies in the groove width direction is deviated from the width of the groove on the front surface side, it is possible to prevent the dicing blade having the degree of taper that causes the breakage of the step portion due to the maximum stress applied to the region of the top portion from being insidiously used. As a result, it is possible to suppress unexpected breakage, and to suppress the breakage of the step portion, compared with a case where the dicing blade having the tip shape that causes the breakage of the step portion due to the maximum stress applied to the region of the top portion is used. When it is necessary to confirm the taper range that applies the maximum stress to the step portion in the region of the top portion, for example, the confirmation can be performed by the stress simulation shown in FIGS. 12A to 13, or by actually forming the groove on the rear surface side to confirm the breakage status. When the groove on the rear surface side is actually formed to confirm the breakage status, for example, the groove on the rear surface side may be actually formed with respect to a narrow and shallow groove on the front surface side, and when the breakage occurs, it may be confirmed whether the breakage occurs from the region of the top portion region or occurs from the root region.

As a second aspect, under the manufacturing condition that the dicing blade having the tapered tip shape that does not have the top surface on the top portion is used and the range where the top portion varies in the groove width direction is deviated from the width of the groove on the front surface side, the dicing blade is exchanged before the dicing blade comes in the taper range that causes the breakage of the step portion as the maximum stress is applied to the region of the top portion due to abrasion of the dicing blade. Accordingly, the breakage of the step portion due to the maximum stress generated in the region of the top portion according to the abrasion of the dicing blade is prevented. Further, when such a manufacturing method is used, the groove on the rear surface side may be formed in a state where the position of each top portion in the groove width direction is deviated from the width of the groove on the front surface side using the design method described in FIG. 17, and using plural dicing blades having different degrees of taper of the tip shape, the degrees of taper that is usable and the degrees of taper that is not usable may be confirmed from the formation result of the groove on the rear surface side, and the dicing blade may be exchanged before the dicing blade reaches the degree of taper that is not usable obtained from the confirmation result.

As a third aspect, under the manufacturing condition that the dicing blade having the tapered tip shape that does not have the top surface in the top portion is used and the range where the top portion varies in the groove width direction is deviated from the width of the groove on the front surface side, the semiconductor piece may be manufactured by the following manufacturing method. For example, under the manufacturing condition that the range where the top portion of the tapered dicing blade that does not have the top surface varies in the groove width direction is deviated from the width of the groove on the front surface side, and that a dicing blade having a degree of taper in which the maximum stress is applied to the step portion in the region of the top portion when the position of the top portion in the groove width direction is deviated from the width of the groove on the front surface side is used, when the position of the top portion in the groove width direction is deviated from the width of the groove on the front surface side, the semiconductor piece is manufactured under the condition that the shape (width or depth) of the groove on the front surface side and the depth that the top portion reaches are set so that the step portion is not broken by the maximum stress. According to this manufacturing method, under the manufacturing condition that the position of the top portion of the dicing blade in the groove width direction is deviated from the width of the groove on the front surface side, even when the dicing blade having the tip shape that applies the maximum stress to the step portion in the region of the top portion is insidiously used, the breakage of the step portion is suppressed. If the above-mentioned setting is not performed, when the position of the top portion of the dicing blade in the groove width direction is deviated from the width of the groove on the front surface side, unexpected breakage may occur. Since the shape of the step portion is determined by the shape (width or depth) of the groove on the front surface side and the depth that the top portion reaches, and the strength of the step portion is determined by the shape of the step portion, if the shape (width or depth) of the groove on the front surface side and the depth that the top portion reaches are set, the strength of the step portion is set.

As a fourth aspect, under the manufacturing condition that the dicing blade having the tapered tip shape that does not have the top surface in the top portion is used and the range where the top portion varies in the groove width direction is deviated from the width of the groove on the front surface side, the semiconductor piece may be manufactured by the following manufacturing method. For example, when the dicing blade is abraded to the degree of taper that applies the maximum stress to the step portion in the region of the top portion during a period when the dicing blade is used, the semiconductor piece is manufactured under the condition that the shape of the groove on the front surface side and the depth that the top portion reaches are set so that the step portion is not broken by the maximum stress. According to this manufacturing method, under the manufacturing condition that the position of the top portion of the dicing blade in the groove width direction is deviated from the width of the groove on the front surface side, even when the dicing blade having the tip shape that applies the maximum stress to the step portion in the region of the top portion is insidiously used according to abrasion, the breakage of the step portion is suppressed. If the above-mentioned setting is not performed, unexpected breakage may occur.

As a fifth aspect, under the manufacturing condition that the range where the center of the thickness of the dicing blade varies in the groove width direction is deviated from the width of the groove 140 on the front surface side, the semiconductor piece may be manufactured by the following manufacturing method. For example, under the manufacturing condition that the range where the center of the thickness of the dicing blade varies in the groove width direction is deviated from the width of the groove on the front surface side, as shown in the experimental result in FIG. 15, both of the taper range that causes the breakage of the step portion since the degree of taper of the tip shape of the dicing blade is small, and the taper range that causes the breakage of the step portion since the degree of taper of the tip shape of the dicing blade is large may be confirmed, and the groove on the rear surface side may be formed in a tip shape having a degree of taper included in a taper range between the ranges to manufacture the semiconductor chip.

This is because if the tip shape of the dicing blade is determined without confirming the taper range that causes the breakage of the step portion since the degree of taper of the tip shape of the dicing blade is large in spite of the manufacturing condition that the range where the center of the thickness of the dicing blade varies in the groove width direction is deviated from the width of the groove 140 on the front surface side, unexpected breakage may occur. When a taper range that generates the maximum stress in the root region of the step portion and a taper range that generates the maximum stress in the root region of the top portion are included in the range between both the above-mentioned ranges, it is preferable to form the groove on the rear surface side using a cutting member that is processed in advance in the tip shape included in the taper range that generates the maximum stress in the root region of the step portion. This is because that the lifespan of the cutting member is prolonged as the degree of taper is small, compared with a case where the cutting member that is processed in advance is used in the tip shape included in the taper range that generates the maximum stress in the region of the top portion.

D-4) Method for Determining Width of Groove on Front Surface Side, and Method for Selecting Manufacturing Apparatus Next, a method for determining the width of the groove on the front surface side and a method for selecting the manufacturing apparatus in consideration of the relationship between the width of the groove on the front surface side and the range where the top portion (or center in the thickness direction) of the dicing blade varies in the groove width direction will be described.

Figure 18:
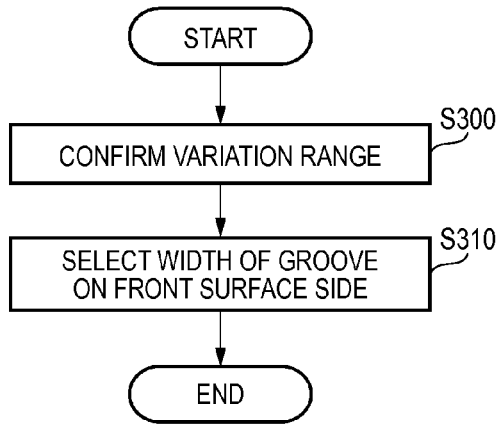
FIG. 18 is a flowchart illustrating a method for determining the width of a groove on a front surface side according to an embodiment of the invention.

FIG. 18 is a diagram illustrating a method for determining the width of the groove on the front surface side according to an embodiment of the invention. First, in S300, the range where the center of the dicing blade in the thickness direction varies in the groove width direction is confirmed. The variation range is caused by the accuracy of a normally used manufacturing apparatus, and for example, is determined by the processing accuracy of the dicing apparatus, the accuracy of detection means (camera or the like) for detecting the position of the fine groove on the front surface side, or the like. Accordingly, the accuracies are confirmed by a product catalogue or actual measurement to detect the range where the center of the dicing blade in the thickness direction varies in the groove width direction. Then, in S310, the width of the groove on the front surface side is determined as a width that includes the variation range confirmed in S300. According to this determination method, the breakage of the step portion is suppressed without concentration of the stress on the region of the top portion, similar to the case where the kerf width is extremely narrow (Sb=11.2) and the positional shift amount Ds is large (Ds=7.5 μm) in FIG. 13.

Further, in S300 of FIG. 18, when the dicing blade having the tapered top portion that does not have the top surface is used, the range where the top portion varies in the groove width direction may be confirmed, and the width of the groove on the front surface side may be determined to include the range. Further, in S310, it is preferable to determine the width of the groove on the front surface side as a narrow width as much as possible, in the width that includes the variation width. This is because when the width of the groove on the front surface side is extremely wide, the number of semiconductor pieces capable of being acquired from one substrate is reduced. For example, when the range where the center of the dicing blade in the thickness direction varies in the groove width direction is ±3 μm, compared with a case where the width of the groove on the front surface side is 10 μm or greater, it is preferable that the width of the groove on the front surface side is set to about 6 μm to about 9 μm, that is, the width of the groove is set to about ±50% of the variation range of the dicing blade.

Figure 19:
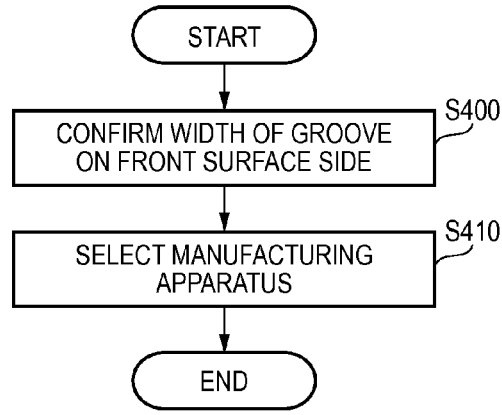
FIG. 19 is a flowchart illustrating a method for selecting a manufacturing apparatus according to an embodiment of the invention.

FIG. 19 is a diagram illustrating a method for selecting the manufacturing apparatus according to an embodiment of the invention. First, the width of the groove on the front surface side is confirmed in S400. More specifically, the width of the groove portion on the front surface side that directly receives the stress from the dicing blade is confirmed. Then, in S410, a manufacturing apparatus to be used is selected so that the range where the center of the dicing blade in the thickness direction varies in the groove width direction is included in the confirmed width on the front surface side. Specifically, the dicing apparatus or the detection means such as a camera having the accuracy in which the range where the center of the dicing blade in the thickness direction varies in the groove width direction is included in the confirmed width on the front surface side is selected. According to such a determination method, the breakage of the step portion is suppressed without concentration of the stress on the region of the top portion, as in the case where the kerf width is extremely narrow (Sb=11.2) and the positional shift amount Ds is large (Ds=7.5 µm) in FIG. 13.

Further, in S410 of FIG. 19, when the dicing blade having the tapered top portion that does not have the top surface is used, the manufacturing apparatus to be used may be selected so that the range where the top portion varies in the groove width direction is included in the confirmed width.

Figure 20:
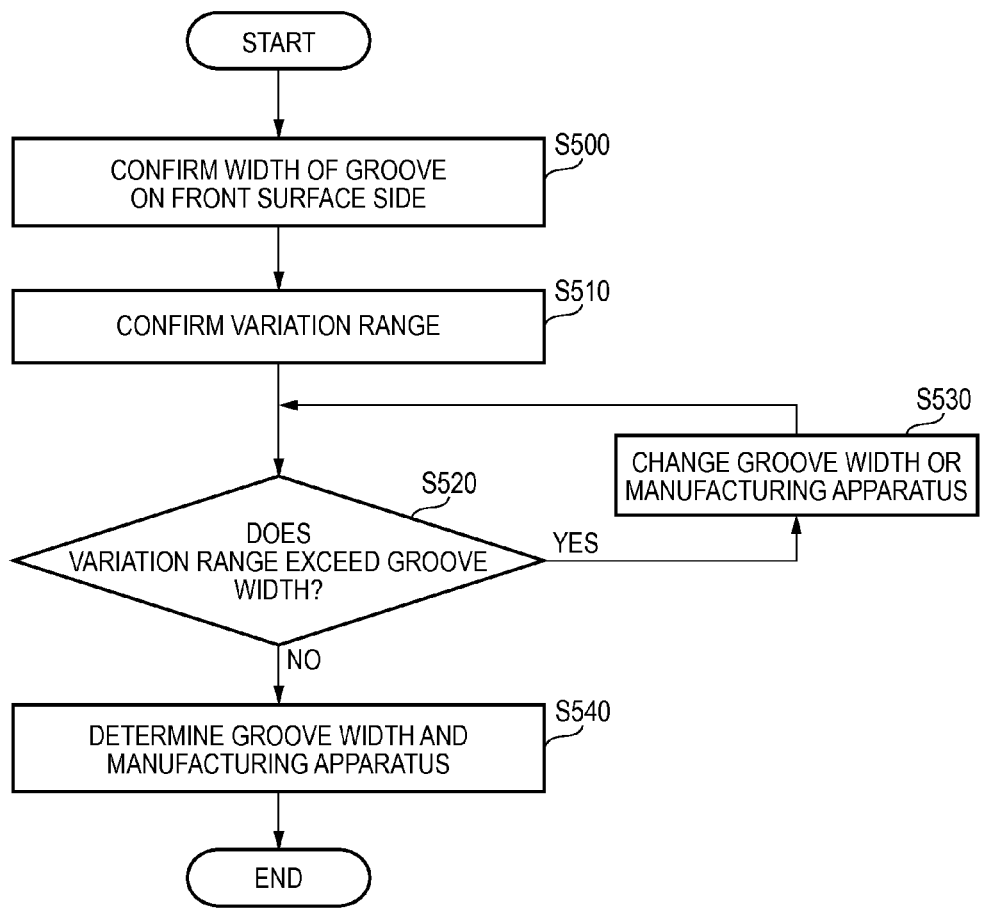
FIG. 20 is a flowchart illustrating another example of a method for determining the width of a groove on a front surface side and a method for selecting a manufacturing apparatus according to an embodiment of the invention.

FIG. 20 is a diagram illustrating another example of the method for determining the width of the groove on the front surface side and the method for selecting the manufacturing apparatus according to the embodiment of the invention. First, in S500 and S510, the width of the groove on the front surface and the range where the dicing blade varies in the groove width direction are confirmed. Details thereof are the same as in FIGS. 18 and 19. Then, in S520, it is confirmed whether the range where the center (or top portion) of the dicing blade in the thickness direction varies in the groove width direction is deviated from the width of the groove on the front surface side. If the deviation is not present (NO in S520), the procedure proceeds to S540 to determine that the width of the groove and the manufacturing apparatus are usable. On the other hand, if the deviation is present (YES in S520), the procedure proceeds to S530 to change at least one of the width of the groove on the front surface side and the manufacturing apparatuses to be used so that the range where the center (or top portion) of the dicing blade in the thickness direction varies in the groove width direction is not deviated from the width of the groove on the front surface side. Accordingly, the breakage of the step portion is suppressed without concentration of the stress on the region of the top portion, as in the case where the kerf width is extremely narrow (Sb=11.2) and the positional shift amount Ds is large (Ds=7.5 µm) in FIG. 13.

Hereinbefore, the design method of the tip shape of the dicing blade, the semiconductor piece manufacturing method, the method for determining the width of the groove on the front surface side, the method for selecting the manufacturing apparatus, and the like based on the relationship between the position of the dicing blade in the groove width direction and the width of the groove 140 on the front surface side based on the accuracy or the like of the manufacturing apparatus have been described, but in the above-mentioned embodiments, as long as there are no particular mention and technical inconsistency, the "manufacturing condition that the center of the thickness of the dicing blade is included in the width of the groove 140 on the front surface side (or deviated from the width of the groove 140 on the front surface side)" may be replaced with "the manufacturing condition that the tapered top portion that does not have the top surface is included in the width of the groove 140 on the front surface side (or deviated from the width of the groove 140 on the front surface side)". Further, as long as there is no particular mention, the process of confirming whether the range where the center or top portion of the thickness of the dicing blade varies in the groove width direction is included in the width of the groove 140 on the front surface side may be provided or may not be provided. Further, the respective configurations or condi-tions in the respective embodiments may be combined with each other as long as there is no technical inconsistency.

E) Embodiment of Pre-Processing of Tip Shape

Next, a process of preparing a dicing blade used in an actual mass production process will be described. This processing process may or may not be applied to the above-described embodiments. In this processing process, before forming the groove on the rear surface side in the actual mass production process, for example, it is necessary to prepare a desired tip shape selected by the design flow of FIG. 17 or the like, but the preparation may be the same as the method described in S200 of FIG. 17. That is, generally, since a dicing blade that is easily available has a rectangular shape, the process of processing the dicing blade into a desired tip shape in advance is provided. Further, in this processing process, the prepared dicing blade is processed until reaching the degree of taper that does not cause the breakage of the step portion. The desired tapered shape prepared by the processing process may be determined by the flow of FIG. 17, or may be determined by a method different from the flow of FIG. 17. In addition, this processing process may or may not be applied to the above-described embodiments.

Next, a more preferred embodiment of the process of processing the tip shape into the desired tip shape in advance will be described. As a first aspect, a rectangular shape or other arbitrary tip shapes are used in general dicing, but in the processing process according to the present embodiment, for example, like a rectangular shape, a dicing blade having a tip shape that applies a stress equal to or greater than the stress that causes the breakage of the step portion to the root region of the step portion is processed to be tapered in advance to have the degree of taper that does not cause the breakage of the step portion. For example, the tip portion is abraded in advance until reaching the degree of taper that does not cause the breakage of the step portion. Accordingly, even the dicing blade having the tip shape that applies the stress equal to or greater than the stress that causes the breakage of the step portion to the root region of the step portion can be used as the dicing blade capable of suppressing the breakage of the step portion. When the step portion is not broken even by the dicing blade having the tip portion of the rectangular shape since the width of the groove on the front surface side is wide and deep, the pre-processing process as in the present embodiment is not necessary. However, when the width of the groove on the front surface side is narrow and shallow, that is, when the stress equal to or greater than the stress that causes the breakage of the step portion is applied to the root region of the step portion as the rectangular tip shape or other arbitrary tip shapes are used, it is preferable to provide the process of processing the tip portion in advance, as in the present embodiment.

As a second aspect, in the process of processing the tip portion in advance, a dicing blade may have a tapered shape compared with the dicing blade having the semicircular tip shape. For example, even when the step portion is not broken even if the tip portion does not have the tapered shape compared with the semicircular shape, the tip portion may have the tapered shape compared with the semicircular shape. This is because, as understood from FIG. 8, since the range where the degree of taper is larger than the degree of taper thereof of the dicing blade having the semicircular tip portion is a range where change in the maximum stress is small and the stress is sufficiently suppressed, even when the tip shape varies from the desired shape in the processing process, the change of the stress with respect to the root region of the step portion is suppressed. As a result, compared with a case where the tip portion has the small degree of taper compared with the dicing blade having the semicircular tip portion, even when the tip shape varies in the processing process, the change of the stress with respect to the root region of the step portion can be suppressed.

As a third aspect, when the process of processing the tip portion in advance is a process of processing the tip portion into a tapered tip shape that does not have a top surface in the top portion, it is preferable that the relationship between a range where the top portion processed in advance varies in the groove width direction and the width of the groove on the front surface side satisfies a relationship that the range where the top portion processed in advance varies in the groove width direction is included in the width of the groove on the front surface side. When the tip portion is processed in advance, the position of the top portion may be deviated from the center of the dicing blade in the thickness direction. Accordingly, if the top portion is included in the width of the groove on the front surface side even though the variation of the tip shape in the processing process is considered, even when the tip shape varies in the processing process, the breakage of the step portion due to the stress concentration on the region of the top portion is suppressed.

As a fourth aspect, when the dicing blade in which the tip portion is processed in advance is used, it is preferable that the relationship between the range where the center of the dicing blade in the thickness direction varies in the groove width direction and the width of the groove on the front surface side satisfies the relationship that the range where the center of the dicing blade in the thickness direction varies in the groove width direction is included in the width of the groove on the front surface side. When the dicing blade is tapered in the processing process of the present embodiment, the tapered top portion is easily formed at the center of the dicing blade in the thickness direction. Accordingly, if the range where the center of the dicing blade in the thickness direction varies in the groove width direction is included in the width of the groove on the front surface side, even when the dicing blade is processed into the degree of taper that causes the stress concentration on the region of the top portion in the processing process, compared with a case where the range where the center of the dicing blade in the thickness direction varies in the groove width direction is not included in the width of the groove on the front surface side, the breakage of the step portion due to the stress concentration on the region of the top portion is suppressed. Further, even when the dicing blade is not tapered up to the degree of taper that causes the stress concentration on the region of the top portion, the dicing blade may be tapered by abrasion in the mass production process, and in this case, the breakage of the step portion due to the stress concentration on the region of the top portion is similarly suppressed.

As a fifth aspect, as the tip shape of the dicing blade before being processed in advance, it is preferable to prepare a dicing blade having a substantially rectangular cross section seen in the rotational direction. Since the dicing blade having the substantially rectangular cross section is a shape normally used in full dicing, the dicing blade is easily available. Further, the dicing blade is easily processed into an arbitrary degree of taper by the processing process. When the substantially rectangular dicing blade is used, it is preferable to confirm whether the step portion is broken by the substantially rectangular dicing blade, in a previous design process. When the step portion is not broken, and when there is no intention to change the shape or the like of the groove on the front surface side, the substantially rectangular dicing blade may be set as a shape to be used in the mass production process as it is. Further, the process of processing the tip in advance may be performed with respect to only the tip shape that causes the breakage of the step portion. According to the present embodiment, by confirming whether the tip shape to be used in the mass production process causes the breakage of the step portion, since the processing process is performed only when the breakage is present, an unnecessary processing process is not performed. Here, the "substantially rectangular shape" includes a shape in which a slightly curved surface is formed in a tip corner portion due to manufacturing variation or the like even though the rectangular shape is intended in the manufacturing process. For example, in a catalogue or the like, a shape intended as the rectangular shape for manufacturing and sale is included in the "substantially rectangular shape" of the present embodiment, regardless of the size of the curved surface in the tip corner portion.

F) Embodiment Relating to Exchange of Blade

Figure 21:
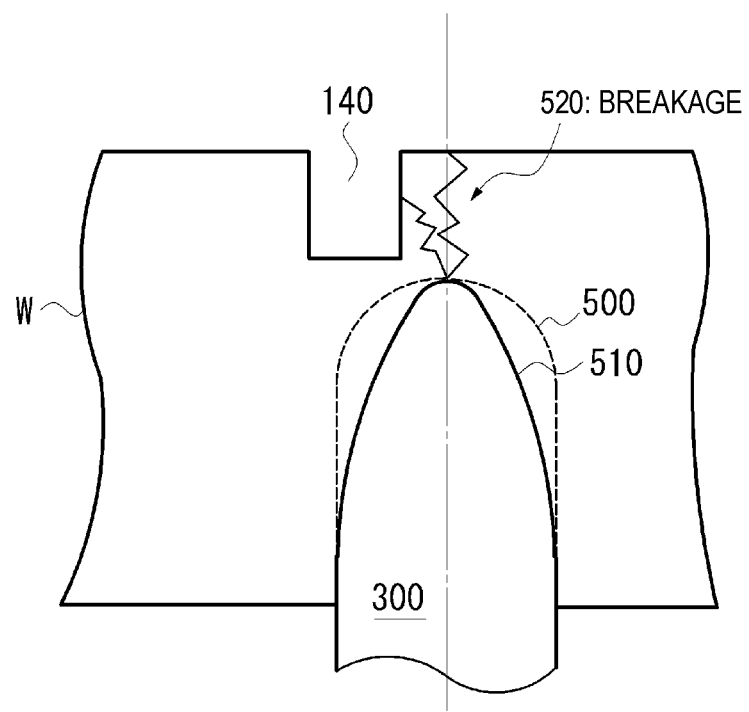
FIG. 21 is a cross-sectional view illustrating a relationship between abrasion of a tip portion of a dicing blade and breakage of a step portion.

Next, a timing of exchange of a dicing blade will be described. If the dicing blade is continuously used, the dicing blade is gradually abraded to have a shape in which its tip is tapered, like a shape shown in FIG. 21. Even when the dicing blade is abraded into the tapered shape in this way, as understood from the simulation result of FIG. 13, under the manufacturing condition of the positional accuracy that the top portion of the tip of the dicing blade is not deviated from the width of the groove 140 on the front surface side of the semiconductor substrate, even though the abraded dicing blade is continuously used, the breakage of the step portion is suppressed. However, under the manufacturing condition of the positional accuracy that the top portion of the tip of the dicing blade is deviated from the width of the groove on the front surface side of the semiconductor substrate, the occurrence rate of the breakage of the step portion increases as the dicing is continuously performed.

A broken line 500 in the figure represents a shape that is an example of an initial dicing blade 300 in the present embodiment, and a solid line 510 in the figure represents a tapered shape that is obtained by abrasion of the dicing blade 300. Here, in the case of the shape 500 of the dicing blade 300, even when the top portion of the dicing blade 300 is deviated from the width of the groove 140 on the front surface side of the semiconductor substrate W due to manufacturing variation or the like, since the stress is dispersed by the curved surface of the tip portion, a large stress is not applied to one point of the step portion, and thus, a possibility that the step portion is broken is low. On the other hand, in the case of the abraded shape 510, since the curved surface is present in the tip portion but the tip portion is tapered, the stress easily concentrates on one point of the step portion, and thus, the breakage 520 easily occurs in the step portion around the stress concentrating portion.

Thus, in the present embodiment, when the tip portion of the dicing blade reaches a predetermined tapered shape by abrasion of the dicing blade, the dicing blade is exchanged with a new one. In other words, when the stress applied to the step portion during dicing reaches a predetermined stress by the abrasion of the dicing blade, even before the lifespan of the dicing blade expires, the dicing blade is exchanged with a new one. That is, under the manufacturing condition of the positional accuracy that the top portion of the tip of the dicing blade is deviated from the width of the groove on the front surface side of the semiconductor substrate, regardless of the lifespan of the dicing blade, the dicing blade is exchanged at the above-mentioned timing. In the normal full dicing, in a state where the tip portion is tapered by the abrasion, breakage such as cracking occurs in the dicing blade due to vibration, shock or the like through the semiconductor substrate during dicing. Accordingly, in the normal full dicing, the timing is experimentally and empirically determined so that the lifespan of the dicing blade is determined, and the exchange is performed based on the lifespan. On the other hand, in the present embodiment, the exchange is performed even before reaching the lifespan determined based on the breakage such as cracking of the dicing blade.

Further, the determination of whether the dicing blade reaches the predetermined tapered shape or the determination of whether the dicing blade reaches the predetermines stress is performed by confirming the relationship between the degree of breakage (breakage rate or the like) that is allowable in the mass production process and the shape or stress of the tip portion by a preliminary experiment, simulation or the like, and calculating in advance a manufacturing condition (accumulated data) such as a total dicing time, a total dicing distance or a total number of diced semiconductor substrates necessary for reaching such a shape or stress of the tip portion. Further, in the mass production process, when the manufacturing condition indicating the degree of abrasion of the dicing blade reaches a predetermined condition, it may be determined that the shape or stress of the tip portion reaches the predetermined tapered shape or the predetermined stress.

Further, instead of determining a specific shape or stress of the tip portion corresponding to the breakage rate that is allowable in the mass production process by the preliminary experiment or simulation, the relationship between the manufacturing condition indicating the degree of abrasion such as the total dicing time, total distance or total number and the breakage status may be calculated from a large number of experiments, and it may be determined whether the shape or stress of the tip portion reaches the predetermined tapered shape or the predetermined stress in the mass production process based on the experiments. Further, as another method, the determination may be performed while actually measuring the shape of the tip in the mass production process. In this case, the thickness from the top portion of the dicing blade to a predetermined distance, the angle of the tip portion or the like may be measured for the determination.

When the manufacturing condition that the top portion of the tip of the dicing blade is not deviated from the width of the groove on the front surface side of the semiconductor chip is selected, or when the thickness of the step portion that does not cause the breakage of the step portion even though the deviation is present is selected, the breakage of the step portion is suppressed. In this case, the dicing blade may be exchanged based on the lifespan of the dicing blade. In order to prevent the top portion of the dicing blade from being deviated from the width of the groove on the front surface side, the relationship between the processing accuracy of the manufacturing method and the width of the groove on the front surface side of the semiconductor substrate may be selected to satisfy the following combination. That is, when the accuracy of the manufacturing apparatus is poor, the width of the groove on the front surface side of the semiconductor substrate may increase, and when the accuracy of the manufacturing apparatus is good, the width of the groove may decrease.

Further, when it is unclear whether a manufacturing condition to be performed is the manufacturing condition that the deviation from the width of the groove is present or the manufacturing condition that the deviation is not present, it is preferable to exchange the dicing blade regardless of the lifespan of the dicing blade on the assumption that the manufacturing condition to be performed is the manufacturing condition that the deviation from the width of the groove is present.

Hereinbefore, the preferred embodiments of the invention have been described, but the invention is not limited to the specific embodiments, and various modifications and changes may be made in the range of the scope of the invention disclosed in claims. For example, the invention may be applied to a case where respective devices (elements) are individualized from a substrate that does not include a semiconductor but is made of glass, polymer or the like. For example, the invention may be applied to a MEMS substrate that does not include a semiconductor. Further, at least a part of the respective processes in the embodiments of the invention may be performed in the design process before the mass production process as long as there is no inconsistency in order, or the entirety of the respective processes may be performed as a part of the mass production process. Further, the respective processes according to the embodiment of the invention may be performed by plural subjects. For example, a first subject may perform the formation of the groove on the front surface side, and a second subject may prepare the substrate by being supplied with the substrate on which the groove on the front surface side is formed by the first subject, may form the groove on the rear surface side on the prepared substrate, and may individualize (divide) the substrate. That is, the substrate on which the groove on the front surface side is formed may be prepared by the first subject, or may be prepared by the second subject.

G) Conclusion of Respective Embodiments and Effects

G-1) Embodiments and Effects Relating to Design Method of Shape of Tip Portion of Blade According to a first aspect, there is provided a design method of a tip shape of a cutting member used in a semiconductor piece manufacturing method includes a process of forming a groove on a front surface side on a front surface of a substrate, and a process of forming a groove on a rear surface side that communicates with the groove on the front surface side by a rotating cutting member that has a thickness larger than the width of the groove on the front surface side from a rear surface of the substrate and individualizing the substrate into semiconductor pieces having a step portion formed by a difference between the width of the groove on the front surface side and the width of the groove on the rear surface side. The design method includes a process of preparing plural cutting members having different degrees of taper in a tip portion thereof, a process of preparing plural grooves on the front surface side having the same shape, a process of confirming a breakage status of the step portion with respect to respective cases where the groove on the rear surface side is formed by the plural cutting members, and a process of selecting, when it is confirmed that both of a cutting member that causes breakage of the step portion and a cutting member that does not cause the breakage of the step portion are included in the plural cutting members with respect to the plural grooves on the front surface side, the degree of taper of the cutting member that does not cause the breakage of the step portion as a tip shape of a cutting member to be used in a mass production process.

According to a second aspect, in the design method of a tip shape of a cutting member according to the first aspect, the plural cutting members includes a tapered cutting member compared with a cutting member having a semicircular tip portion.

According to a third aspect, in the design method of a tip shape of a cutting member according to the second aspect, the plural cutting members includes a cutting member having a small degree of taper compared with the cutting member having the semicircular tip portion.

According to a fourth aspect, in the design method of a tip shape of a cutting member according to any one of the first aspect to the third aspect, the plural cutting members includes plural cutting members having a small degree of taper compared with the cutting member having the semicircular tip portion.

According to a fifth aspect, in the design method of a tip shape of a cutting member according to any one of the first aspect to the fourth aspect, the plural cutting members includes at least three types of cutting members having a small degree of taper compared with the cutting member having the semicircular tip portion.

According to a sixth aspect, in the design method of a tip shape of a cutting member according to any one of the first aspect to the fifth aspect, the plural cutting members includes a tapered cutting member that does not have a top surface in a top portion thereof and has, when the position of the top portion in a groove width direction is deviated from the width of the groove on the front surface side, a degree of taper that generates a maximum stress in a region of the top portion that is deviated from the width of the groove.

According to a seventh aspect, in the design method of a tip shape of a cutting member according to the sixth aspect, the plural cutting members includes plural cutting members having the degree of taper that generates the maximum stress applied to the region of the top portion.

According to an eighth aspect, in the design method of a tip shape of a cutting member according to any one of the first aspect to the seventh aspect, when it is confirmed that both of the cutting member that causes the breakage of the step portion and the cutting member that does not cause the breakage of the step portion are included in the plural cutting members, the degree of taper of the cutting member that causes the breakage of the step portion is excluded from a selection target as a tip shape of a cutting member that is not used in the mass production process.

According to a ninth aspect, there is provided a design method of a tip shape of a cutting member used in a semiconductor piece manufacturing method includes a process of forming a groove on a front surface side on a front surface of a substrate, and a process of forming a groove on a rear surface side that communicates with the groove on the front surface side by a rotating cutting member that has a thickness larger than the width of the groove on the front surface side from a rear surface of the substrate and individualizing the substrate into semiconductor pieces having a step portion formed by a difference between the width of the groove on the front surface side and the width of the groove on the rear surface side. The design method includes a process of preparing plural cutting members having different degrees of taper in a tip portion thereof, a process of preparing plural grooves on the front surface having the same shape, a process of confirming a breakage status of the step portion with respect to respective cases where the groove on the rear surface side is formed by the plural cutting members, a process of estimating, when both of a cutting member that causes breakage of the step portion and a cutting member that does not cause the breakage of the step portion are included in the plural cutting members with respect to the plural grooves on the front surface side, a taper range of the cutting member that does not cause the breakage of the step portion from the confirmation result, and a process of selecting a cutting member having the degree of taper included in the estimated range as a tip shape of a cutting member to be used in a mass production process.

According to a tenth aspect, there is provided a semiconductor piece manufacturing method for individualizing the substrate into the semiconductor pieces by the manufacturing method using the cutting member having the tip shape designed by the design method according to any one of the first aspect to the ninth aspect.

According to an eleventh aspect, there is provided a circuit board mounted with at least one semiconductor piece manufactured by the manufacturing method according to the tenth aspect.

According to a twelfth aspect, there is provided an electronic apparatus mounted with the circuit board according to the eleventh aspect.

According to the first, eighth, and ninth aspects, compared with a case where the tip shape of the cutting member is determined without considering the relationship between the degree of taper of the cutting member and the breakage of the step portion, it is possible to employ a more shallow groove on the front surface side in the mass production process.

According to the second aspect, it is possible to confirm whether the step portion is broken under a condition close to the condition that the maximum stress to the root region of the step portion becomes smallest.

According to the third aspect, compared with a case where the cutting member having the small degree of taper compared with the cutting member having the semicircular tip portion is not included as the plural cutting members, it is easy to select the tip shape.

According to the fourth aspect, compared with a case where only one type of cutting member having the small degree of taper compared with the cutting member having the semicircular tip portion is included, it is possible to easily confirm what extent the degree of taper can decrease to in a range where the step portion is not broken.

According to the fifth aspect, compared with a case where only two types of cutting members having the small degree of taper compared with the cutting member having the semicircular tip portion are included, it is possible to easily confirm what extent the degree of taper can decrease to in a range where the step portion is not broken.

According to the sixth aspect, when the position of the top portion in the groove width direction is deviated from the width of the groove on the front surface side, it is possible to avoid a state where it is completely impossible to confirm what extent the degree of taper can increase to in a range where the step portion is not broken.

According to the seventh aspect, compared with a case where only one type of cutting member of the tip shape that generates the maximum stress at the position of the top portion of the cutting member is included, it is possible to easily confirm what extent the degree of taper can increase to in a range where the step portion is not broken.

G-2) Embodiments and Effects Relating to Relationship Between Positional Shift of Blade and Shape of Tip Portion of Blade According to a first aspect, there is provided a semiconductor piece manufacturing method including a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side, in which under a manufacturing condition that a range where the center of the thickness of the cutting member varies in a groove width direction is included in the width of the groove on the front surface side, a first taper range that causes breakage of the step portion since the degree of taper of a tip shape of the cutting member is small is confirmed, and the groove on the rear surface side is formed by a cutting member having a tip shape of a degree of taper larger than the confirmed range.

According to a second aspect, there is provided a semiconductor piece manufacturing method including: a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side, in which under a manufacturing condition that the cutting member having a taper, which does not have a top surface in a top portion thereof, is used and a range where the top portion varies in a groove width direction is included in the width of the groove on the front surface side, a first taper range that causes breakage of the step portion since the degree of taper of a tip shape of the cutting member is small is confirmed, and the groove on the rear surface side is formed by a cutting member having a tip shape of a degree of taper larger than the confirmed range.

According to a third aspect, there is provided a semiconductor piece manufacturing method including: a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side, in which under a manufacturing condition that a range where the center of the thickness of the cutting member varies in a groove width direction is included in the width of the groove on the front surface side, a first taper range that causes breakage of the step portion since the degree of taper of a tip shape of the cutting member is small is confirmed, and a cutting member that has the degree of taper included in the confirmed range is not used when the groove on the rear surface side is formed.

According to a fourth aspect, there is provided a semiconductor piece manufacturing method including: a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side, in which under a manufacturing condition that the cutting member having a taper, which does not have a top surface in a top portion thereof, is used and a range where the top portion varies in a groove width direction is included in the width of the groove on the front surface side, a first taper range that causes breakage of the step portion since the degree of taper of a tip shape of the cutting member is small is confirmed, and a cutting member that has the degree of taper included in the confirmed range is not used when the groove on the rear surface side is formed.

According to a fifth aspect, there is provided a semiconductor piece manufacturing method including: a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side, in which under a manufacturing condition that a range where the center of the thickness of the cutting member varies in a groove width direction is deviated from the width of the groove on the front surface side, a first taper range that causes breakage of the step portion since the degree of taper of a tip shape of the cutting member is small and a second taper range that causes the breakage of the step portion since the degree of taper of the tip shape of the cutting member is large are confirmed, and the groove on the rear surface side is formed by a cutting member having a degree of taper included in a third taper range between the first taper range and the second taper range.

According to a sixth aspect, there is provided a semiconductor piece manufacturing method including: a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side, in which under a manufacturing condition that the cutting member having a taper, which does not have a top surface in a top portion thereof, is used and a range where the top portion varies in a groove width direction is deviated from the width of the groove on the front surface side, a first taper range that causes breakage of the step portion since the degree of taper of a tip shape of the cutting member is small and a second taper range that causes the breakage of the step portion since the degree of taper of the tip shape of the cutting member is large are confirmed, and the groove on the rear surface side is formed by a cutting member having a degree of taper included in a third taper range between the first taper range and the second taper range.

According to a seventh aspect, in the semiconductor piece manufacturing method according to the fifth aspect or the sixth aspect, when a taper range that generates the maximum stress in a root region of the step portion and a taper range that generates the maximum stress in a region of the top portion are included in the third taper range, the groove on the rear surface side is formed by a cutting member that is processed in advance in a tip shape included in the taper range that generates the maximum stress in the root of the step portion.

According to an eighth aspect, there is provided a circuit board mounted with at least one semiconductor piece manufactured by the manufacturing method according to any one of the first aspect to the seventh aspect.

According to a ninth aspect, there is provided an electronic apparatus mounted with the circuit board according to the eighth aspect.

According to the first, second, third, and fourth aspects, compared with a case where a cutting member having an arbitrary tip shape is used without confirmation of the taper range that causes the breakage of the step portion since the degree of taper of the tip shape is small, it is possible to suppress breakage of the semiconductor piece.

According to the fifth and sixth aspects, compared with a case where a cutting member having an arbitrary tip shape is used without confirmation of the first taper range and the second taper range, it is possible to suppress breakage of the semiconductor piece.

According to the seventh aspect, compared with a case where a cutting member that is processed in advance in a tip shape included in the taper range that generates the maximum stress in the region of the top portion is used, it is possible to lengthen the lifespan of the cutting member.

G-3) Embodiments and Effects when Top Portion of Blade is Included in Groove on Front Surface Side According to a first aspect, there is provided a semiconductor piece manufacturing method including: a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side, in which under a manufacturing condition that the step portion has a strength such that the step portion is broken when the cutting member having a cross section of a rectangular tip shape seen in a rotational direction is used and a range where the center of the thickness of the cutting member varies in a groove width direction is included in the width of the groove on the front surface side, the groove on the rear surface side is formed by the cutting member of a tip shape having a degree of taper larger than a taper range that causes the breakage of the step portion.

According to a second aspect, there is provided a semiconductor piece manufacturing method including: a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side, in which under a manufacturing condition that the cutting member has a tapered tip shape that does not have a top surface in a top portion thereof, the step portion has a strength such that the step portion is broken when the cutting member having a cross section of a rectangular tip shape seen in a rotational direction is used, and a range where the top portion varies in a groove width direction is included in the width of the groove on the front surface side, the groove on the rear surface side is formed by the cutting member of a tip shape having a degree of taper larger than a taper range that causes the breakage of the step portion.

According to a third aspect, in the semiconductor piece manufacturing method according to the first aspect or the second aspect, the cutting member is a tapered cutting member compared with a cutting member having a semi-circular tip portion.

According to a fourth aspect, in the semiconductor piece manufacturing method according to any one of the first aspect to the third aspect, the cutting member is a cutting member having a degree of taper that generates a small stress compared with the cutting member having the semi-circular tip portion in a root portion of the step portion.

According to a fifth aspect, there is provided a circuit board mounted with at least one semiconductor piece manufactured by the manufacturing method according to any one of the first aspect to the fourth aspect.

According to a sixth aspect, there is provided an electronic apparatus mounted with the circuit board according to the fifth aspect.

According to the first and second aspects, it is possible to individualize the substrate without the breakage of the step portion of the semiconductor piece due to the stress from the cutting member, even using a narrow and shallow groove shape on the front surface where the step portion is broken when the cutting member having the rectangular tip shape is used.

According to the third aspect, it is possible to form the groove on the rear surface side using a region where the stress applied to the step portion is saturated at a low level.

According to the fourth aspect, it is possible to form the groove on the rear surface side using a region where the stress applied to the step portion is saturated at a low level.

G-4) Embodiments and Effects when Top Portion of Blade is Deviated from Groove on Front Surface Side According to a first aspect, there is provided a semiconductor piece manufacturing method including: a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side, in which under a manufacturing condition that the cutting member having a taper, which does not have a top surface in a top portion thereof, is used and a range where the top portion varies in a groove width direction is deviated from the width of the groove on the front surface side, the groove on the rear surface side is formed by a cutting member having a tip shape of a degree of taper smaller than a taper range that causes breakage of the step portion due to a maximum stress applied to a region of the top portion.

According to a second aspect, in the semiconductor piece manufacturing method according to the first aspect, the cutting member is exchanged before the tip shape of the cutting member comes in the taper range that causes the breakage of the step portion due to the maximum stress applied to the region of the top portion.

According to a third aspect, there is provided a semiconductor piece manufacturing method including: a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side, in which under a manufacturing condition that a range where a top portion of the cutting member having a taper, which does not have a top surface, varies in a groove width direction is deviated from the width of the groove on the front surface side, and that a cutting member having a degree of taper that applies a maximum stress to the step portion in a region of the top portion, when the position of the top portion in the groove width direction is deviated from the width of the groove on the front surface side, is used, the shape of the groove on the front surface side and a depth that the top portion reaches are set so that the step portion is not broken by the maximum stress when the position of the top portion in the groove width direction is deviated from the width of the groove on the front surface side.

According to a fourth aspect, there is provided a semiconductor piece manufacturing method including: a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side, in which under a manufacturing condition that the cutting member having a taper, which does not have a top surface in a top portion thereof, is used and a range where the top portion varies in a groove width direction is deviated from the width of the groove on the front surface side, when the cutting member is abraded to a degree of taper that applies a maximum stress to the step portion in a region of the top portion during a period when the cutting member is used, the shape of the groove on the front surface side and a depth that the top portion reaches are set so that the step portion is not broken by the maximum stress.

According to a fifth aspect, there is provided a circuit board mounted with at least one semiconductor chip manufactured by the manufacturing method according to any one of the first aspect to the fourth aspect.

According to a sixth aspect, there is provided an electronic apparatus mounted with the circuit board according to the fifth aspect.

According to the first aspect, under the manufacturing condition that the range where the top portion of the cutting member varies in the groove width direction is deviated from the width of the groove on the front surface side, compared with a case where the cutting member having the degree of taper that causes the breakage of the step portion due to the maximum stress applied to the region of the top portion is insidiously used, it is possible to suppress the breakage of the step portion.

According to the second aspect, compared with a case where the cutting member is not exchanged even in the tip shape of the cutting member has the taper range that causes the breakage of the step portion due to the maximum stress applied to the region of the top portion, it is possible to suppress the breakage of the semiconductor piece.

According to the third and fourth aspects, under the manufacturing condition that the range where the top portion of the cutting member varies in the groove width direction is deviated from the width of the groove on the front surface side, even in a case where the cutting member having the degree of taper that applies the maximum stress to the step portion in the region of the top portion is insidiously used, it is possible to suppress the breakage of the step portion.

G-5) Embodiments and Effects Relating to Process of Processing of Tip Portion of Blade According to a first aspect, there is provided a semiconductor piece manufacturing method including: a process of forming a groove on a front surface side on a front surface of a substrate, a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side, and a process of processing in advance a tip portion of the cutting member before the groove on the front surface side is formed, the processing process being a process of tapering the cutting member having a tip portion that applies a stress equal to or greater than a stress that causes breakage of the step portion to a root region of the step portion to have a degree of taper that does not cause the breakage of the step portion by the stress to the root region.

According to a second aspect, in the semiconductor manufacturing method according to the first aspect, the processing process is a process of forming the tip portion into a tapered shape compared with a cutting member having a semicircular tip shape.

According to a third aspect, in the semiconductor manufacturing method according to the first aspect or the second aspect, the processing process is a process of processing the tip shape into a tapered tip shape that does not have a top surface in a top portion, in which a range where the top portion varies in a groove width direction is included in the width of the groove on the front surface side.

According to a fourth aspect, in the semiconductor manufacturing method according to the first aspect or the second aspect, a range where the center of the cutting member in a thickness direction varies in a groove width direction is included in the width of the groove on the front surface side.

According to a fifth aspect, the semiconductor manufacturing method according to any one of the first aspect to the fourth aspect further includes a process of preparing a cutting member having a substantially rectangular cross section seen in a rotational direction, and a process of confirming a breakage status of the step portion when the groove on the rear surface side is formed using the prepared cutting member, in which when the step portion is broken by the prepared cutting member, the processing process is performed.

According to a sixth aspect, there is provided a circuit board mounted with at least one semiconductor piece manufactured by the manufacturing method according to any one of the first aspect to the fifth aspect.

According to a seventh aspect, there is provided an electronic apparatus mounted with the circuit board according to the sixth aspect.

According to the first aspect, when the cutting member having the tip shape that applies the stress equal to or greater than the stress that causes the breakage of the step portion to the root region of the step portion is used, it is possible to individualize the substrate without the breakage of the step portion due to the stress to the root region of the step portion.

According to the second aspect, compared with a case where the degree of taper is small compared with the cutting member having the semicircular tip shape, even when the tip shape varies in the processing process, it is possible to suppress the change of the stress to the root region of the step portion.

According to the third aspect, compared with a case where the range where the top portion varies in the groove width direction is deviated from the width of the groove on the front surface side, it is possible to suppress the breakage of the step portion.

According to the fourth aspect, compared with a case where the range where the center of the cutting member in the thickness direction varies in the groove width direction is deviated from the width of the groove on the front surface side, it is possible to suppress the breakage of the step portion.

According to the fifth aspect, it is possible to perform the processing process only when the processing process is necessary.

G-6) Embodiments and Effects Relating to Method for Determining Width of Groove on Front Surface Side and Method for Selecting Manufacturing Apparatus According to a first aspect, there is provided a method for determining a manufacturing condition in a semiconductor piece manufacturing method including a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side. The method for determining the manufacturing condition in the semiconductor piece manufacturing method includes a process of confirming a range where the center of the cutting member in a thickness direction varies in a groove width direction, and a process of determining the width of the groove on the front surface side as a width that includes the confirmed range.

According to a second aspect, there is provided a method for determining a manufacturing condition in a semiconductor piece manufacturing method including: a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side. The method for determining the manufacturing condition in the semiconductor piece manufacturing method includes a process of confirming, when a cutting member having a tapered top portion that does not have a top surface is used, a range where the top portion varies in a groove width direction, and a process of determining the width of the groove on the front surface side as a width that includes the confirmed range.

According to a third aspect, there is provided a method for determining a manufacturing condition in a semiconductor piece manufacturing method including a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side. The method for determining the manufacturing condition in the semiconductor piece manufacturing method includes a process of confirming the width of the groove on the front surface, and a process of selecting a manufacturing apparatus to be used in the manufacturing method so that a range where the center of the cutting member in a thickness direction varies in a groove width direction is included in the confirmed width.

According to a fourth aspect, there is provided a method for determining a manufacturing condition in a semiconductor piece manufacturing method including a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side. The method for determining the manufacturing condition in the semiconductor piece manufacturing method includes a process of confirming the width of the groove on the front surface, and a process of selecting, when a cutting member having a tapered top portion that does not have a top surface is used, a manufacturing apparatus to be used in the manufacturing method so that a range where the top portion varies in a groove width direction is included in the confirmed width.

According to a fifth aspect, there is provided a method for determining a manufacturing condition in a semiconductor piece manufacturing method including a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side. The method for determining the manufacturing condition in the semiconductor piece manufacturing method includes a process of confirming whether a range where the center of the cutting member in a thickness direction varies in a groove width direction is deviated from the width of the groove on the front surface side, and a process of changing, when the range is deviated from the width of the groove on the front surface side, at least one of the width of the groove on the front surface side and a manufacturing apparatus that affects the range so that the range is equal to or smaller than the width of the groove on the front surface side.

According to a sixth aspect, there is provided a method for determining a manufacturing condition in a semiconductor piece manufacturing method including a process of forming a groove on a front surface side on a front surface of a substrate, and a process of forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side. The method for determining the manufacturing condition in the semiconductor piece manufacturing method includes a process of confirming, when a cutting member having a tapered tip shape that does not have a top surface in a top portion thereof is used, whether a range where the top portion varies in a groove width direction is deviated from the width of the groove on the front surface side, and a process of changing, when the range is deviated from the width of the groove on the front surface side, at least one of the width of the groove on the front surface side, and a manufacturing apparatus that affects the range so that the range is equal to or smaller than the width of the groove on the front surface side.

According to a seventh aspect, there is provided a semiconductor piece manufacturing method for individualizing a substrate into semiconductor pieces by the manufacturing method, using the manufacturing condition determined by the determination method according to any one of the first aspect to the sixth aspect.

According to an eighth aspect, there is provided a circuit board mounted with at least one semiconductor piece manufactured by the manufacturing method according to the seventh aspect.

According to a ninth aspect, there is provided an electronic apparatus mounted with the circuit board according to the eighth aspect.

According to the first, third, and fifth aspects, compared with a case where the width of the groove on the front surface side is determined without confirming the range where the center of the cutting member in the thickness direction varies in the groove width direction, it is possible to suppress the breakage of the step portion due to stress concentration on the region of the top portion.

According to the second, fourth, and sixth aspect, the step portion is not broken as the stress concentrates on the region of the top portion.

INDUSTRIAL APPLICABILITY

The semiconductor piece manufacturing method of the invention is applied to a method for dividing (individualizing) a substrate shaped member such as a semiconductor wafer on which plural semiconductor devices are formed to manufacture individual semiconductor pieces (semiconductor chips). The semiconductor device formed on the substrate is not particularly limited, and may include a light emitting device, an active device, a passive device, or the like. In a preferred embodiment, the manufacturing method of the invention is applied to a method for extracting a semiconductor piece that includes a light emitting device from a substrate, in which the light emitting device may be a surface emitting semiconductor laser, a light emitting diode or a light emitting thyristor, for example.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A design method of a tip shape of a cutting member used in a semiconductor piece manufacturing method including
    forming a groove on a front surface side on a front surface of a substrate, and
    forming a groove on a rear surface side that communicates with the groove on the front surface side by a rotating cutting member that has a thickness larger than the width of the groove on the front surface side from a rear surface of the substrate and individualizing the substrate into semiconductor pieces having a step portion formed by a difference between the width of the groove on the front surface side and the width of the groove on the rear surface side, the design method comprising:
    preparing a plurality of cutting members having different degrees of taper in a tip portion thereof;
    preparing a plurality of grooves on the front surface side having substantially the same shape;
    confirming a breakage status of the step portion with respect to respective cases where the groove on the rear surface side is formed by the plural cutting members with respect to the plural grooves on the front surface side; and
    selecting, when it is confirmed that both of a cutting member that causes breakage of the step portion and a cutting member that does not cause the breakage of the step portion are included in the plurality of cutting members, the degree of taper of the cutting member that does not cause the breakage of the step portion as a tip shape of a cutting member to be used in a mass production process.

2. The design method of a tip shape of a cutting member according to claim 1,
    wherein the plurality of cutting members includes a tapered cutting member compared with a cutting member having a semicircular tip portion.

3. The design method of a tip shape of a cutting member according to claim 2,
    wherein the plurality of cutting members includes a cutting member having a small degree of taper compared with the cutting member having the semicircular tip portion.

4. The design method of a tip shape of a cutting member according to claim 1,
    wherein the plurality of cutting members includes a plurality of cutting members having a small degree of taper compared with a cutting member having a semicircular tip portion.

5. The design method of a tip shape of a cutting member according to claim 1,
    wherein the plurality of cutting members includes at least three types of cutting members having a small degree of taper compared with a cutting member having a semicircular tip portion.

6. The design method of a tip shape of a cutting member according to claim 1,
    wherein the plurality of cutting members includes a cutting member having a tapered tip shape that does not have a top surface in a top portion thereof and having, when the position of the top portion in a groove width direction is deviated from the width of the groove on the front surface side, a degree of taper that generates a maximum stress in a region of the top portion deviated from the width of the groove.

7. The design method of a tip shape of a cutting member according to claim 6,
wherein the cutting member having the degree of taper that generates the maximum stress in the region of the top portion is provided in plurality.

8. The design method of a tip shape of a cutting member according to claim 1,
wherein when it is confirmed that both of the cutting member that causes the breakage of the step portion and the cutting member that does not cause the breakage of the step portion are included in the plurality of cutting members, the degree of taper of the cutting member that causes the breakage of the step portion is excluded from a selection target as the tip shape of the cutting member that is not used in the mass production process.

9. A semiconductor piece manufacturing method for individualizing a substrate into semiconductor pieces by the manufacturing method, using the cutting member having the tip shape designed by the design method according to claim 1.

10. A circuit board mounted with at least one semiconductor piece manufactured by the manufacturing method according to claim 9.

11. An electronic apparatus mounted with the circuit board according to claim 10.

12. A design method of a tip shape of a cutting member used in a semiconductor piece manufacturing method including forming a groove on a front surface side on a front surface of a substrate, and forming a groove on a rear surface side that communicates with the groove on the front surface side by a rotating cutting member having a thickness larger than the width of the groove on the front surface side from a rear surface of the substrate and individualizing the substrate into semiconductor pieces having a step portion formed by a difference between the width of the groove on the front surface side and the width of the groove on the rear surface side, the design method comprising:

preparing a plurality of cutting members having different degrees of taper in a tip portion thereof;

preparing a plurality of grooves on the front surface side having substantially the same shape;

confirming a breakage status of the step portion with respect to respective cases where the groove on the rear surface side is formed by the plurality of cutting members with respect to the plurality of grooves on the front surface side;

estimating, when both of a cutting member that causes breakage of the step portion and a cutting member that does not cause the breakage of the step portion are included in the plurality cutting members, a taper range of the cutting member that does not cause the breakage of the step portion from the confirmation result; and selecting a cutting member having a degree of taper included in the estimated range as a tip shape of a cutting member to be used in a mass production process.

* * * * *